United States Patent
Wolk et al.

(10) Patent No.: US 10,475,858 B2
(45) Date of Patent: Nov. 12, 2019

(54) NANOSTRUCTURES FOR COLOR-BY-WHITE OLED DEVICES

(71) Applicant: 3M INNOVATIVE PROPERTIES COMPANY, St. Paul, MN (US)

(72) Inventors: Martin B. Wolk, Woodbury, MN (US); Seong Taek Lee, Woodbury, MN (US); Michael Benton Free, St. Paul, MN (US); Nicholas C. Erickson, St. Paul, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 16/002,426

(22) Filed: Jun. 7, 2018

(65) Prior Publication Data
US 2018/0294317 A1    Oct. 11, 2018

Related U.S. Application Data

(63) Continuation of application No. 15/126,322, filed as application No. PCT/US2015/021376 on Mar. 19, 2015, now Pat. No. 9,997,573.
(Continued)

(51) Int. Cl.
*H01L 51/52* (2006.01)
*H01L 27/32* (2006.01)
(Continued)

(52) U.S. Cl.
CPC .......... *H01L 27/322* (2013.01); *G02B 5/0215* (2013.01); *G02B 5/201* (2013.01); *H01L 51/5268* (2013.01); *H01L 51/5275* (2013.01)

(58) Field of Classification Search
CPC ............ H01L 51/5268; H01L 51/5275; H01L 51/5257; H01L 27/322; G02B 5/201; G02B 5/02; G02B 5/0231; G02B 5/0215
See application file for complete search history.

(56) References Cited

U.S. PATENT DOCUMENTS

| 4,472,480 A | 9/1984 | Olson |
| 4,567,073 A | 1/1986 | Larson |

(Continued)

FOREIGN PATENT DOCUMENTS

| JP | 2007-134153 | 5/2007 |
| WO | WO 2008-118610 | 10/2008 |

(Continued)

OTHER PUBLICATIONS

Cannistra, "Micro-transfer molding of SU-8 micro-optics", Advanced Fabrication Technologies for Micro/Nano Optics and Photonics, 2008, vol. 6883, pp. 1-9.

(Continued)

*Primary Examiner* — Caridad Everhart
(74) *Attorney, Agent, or Firm* — Jonathan L. Tolstedt

(57) ABSTRACT

The present disclosure describes nanostructured light extraction color filter laminates, and articles and methods of using nanostructured light extraction color filter laminates for the fabrication of an OLED including a nanostructure, using lamination techniques. Nanostructured OLED devices can exhibit enhanced light extraction efficiency. The methods involve transfer and/or replication of a film, layer, or coating in order to form a nanostructured surface that is in optical contact with the emitting surface of an OLED in, for example, a top emitting or a bottom emitting active matrix OLED (TE-AMOLED or BE-AMOLED) device. The articles having enhanced light extraction efficiency can be of particular use in color-by-white (CBW) OLED displays, which use white-light spectrum OLEDs with a color filter array.

2 Claims, 9 Drawing Sheets

Related U.S. Application Data

(60) Provisional application No. 61/955,556, filed on Mar. 19, 2014, provisional application No. 62/084,049, filed on Nov. 25, 2014.

(51) Int. Cl.
  *G02B 5/20* (2006.01)
  *G02B 5/02* (2006.01)

(56) References Cited

U.S. PATENT DOCUMENTS

| | | |
|---|---|---|
| 4,614,667 A | 9/1986 | Larson |
| 5,691,846 A | 11/1997 | Benson, Jr. |
| 6,329,058 B1 | 12/2001 | Arney |
| 6,366,013 B1 | 4/2002 | Leenders |
| 6,396,079 B1 | 5/2002 | Hayashi |
| 6,521,324 B1 | 2/2003 | Debe |
| 6,849,558 B2 | 2/2005 | Schaper |
| 6,858,253 B2 | 2/2005 | Williams |
| 7,384,809 B2 | 6/2008 | Donofrio |
| 7,468,211 B2 | 12/2008 | McCormick |
| 7,510,913 B2 | 3/2009 | Moro |
| 9,246,134 B2 | 10/2016 | Collier |
| 2004/0253413 A1 | 12/2004 | Baba |
| 2005/0118352 A1 | 6/2005 | Suwa |
| 2006/0066922 A1 | 3/2006 | Nishi |
| 2006/0125388 A1 | 6/2006 | Song |
| 2006/0270806 A1 | 11/2006 | Hale |
| 2007/0020451 A1 | 1/2007 | Padiyath |
| 2007/0042174 A1 | 2/2007 | Rao |
| 2007/0102621 A1* | 5/2007 | Kim .............. H01L 27/14627 250/208.1 |
| 2007/0200492 A1* | 8/2007 | Cok .............. H01L 27/322 313/506 |
| 2007/0247714 A1* | 10/2007 | Schnieper ........ G02B 5/1809 359/558 |
| 2008/0042154 A1 | 2/2008 | Wano |
| 2009/0015142 A1 | 1/2009 | Potts |
| 2009/0256287 A1 | 10/2009 | Fu |
| 2009/0263668 A1 | 10/2009 | David |
| 2009/0322219 A1 | 12/2009 | Wolk |
| 2010/0006211 A1 | 1/2010 | Wolk |
| 2010/0104807 A1 | 4/2010 | Chiu |
| 2010/0128351 A1 | 5/2010 | Epstein |
| 2010/0151207 A1 | 6/2010 | Hansen |
| 2010/0160577 A1 | 6/2010 | Hirano |
| 2010/0239783 A1 | 9/2010 | Mao |
| 2011/0182805 A1 | 7/2011 | DeSimone |
| 2011/0278772 A1 | 11/2011 | Inamiya |
| 2011/0281068 A1 | 11/2011 | David |
| 2011/0305787 A1 | 12/2011 | Ishii |
| 2012/0012557 A1 | 1/2012 | David |
| 2012/0057235 A1 | 3/2012 | Chang et al. |
| 2012/0099323 A1 | 4/2012 | Thompson |
| 2012/0234460 A1 | 9/2012 | Zhang |
| 2012/0328829 A1 | 12/2012 | Vang |
| 2013/0038949 A1 | 2/2013 | David |
| 2013/0319522 A1 | 12/2013 | Kioke |
| 2013/0344290 A1 | 12/2013 | Yu |
| 2014/0004304 A1 | 1/2014 | Yu |
| 2014/0021492 A1 | 1/2014 | Wolk |
| 2014/0175707 A1 | 6/2014 | Wolk |
| 2014/0178646 A1 | 6/2014 | Wolk |
| 2014/0242343 A1 | 8/2014 | Free |
| 2014/0299958 A1* | 10/2014 | Kokumai .......... H01L 27/1463 257/446 |
| 2015/0011031 A1 | 1/2015 | Cho |
| 2015/0115226 A1* | 4/2015 | Scire .............. H01L 27/288 257/40 |
| 2015/0202834 A1 | 7/2015 | Free |
| 2016/0096316 A1 | 4/2016 | Wolk |
| 2016/0104851 A1 | 4/2016 | Wolk |

FOREIGN PATENT DOCUMENTS

| | | |
|---|---|---|
| WO | WO 2010-051229 | 5/2010 |
| WO | WO 2010-077521 | 7/2010 |
| WO | WO 2011-088161 | 7/2011 |
| WO | WO 2012-077738 | 6/2012 |
| WO | WO 2012-082536 | 6/2012 |
| WO | WO 2013-025614 | 2/2013 |
| WO | WO 2013-148031 | 10/2013 |
| WO | WO 2015-069444 | 5/2015 |
| WO | WO 2015-108773 | 7/2015 |
| WO | WO 2015-112711 | 7/2015 |
| WO | WO 2015-143102 | 9/2015 |

OTHER PUBLICATIONS

Chiniwalla, "Multilayer Planarization of Polymer Dielectrics", IEEE Transactions on Advanced Packaging, 2001, vol. 24, No. 1, pp. 41-53.

Domanski, "Production and characterization of miro- and nano-features in biomedical alumina and zirconia ceramics using a tape casting route", Journal of Materials Science: Materials in Medicine, 2012, vol. 23, pp. 1637-1644.

Gale, "Replication technology for optical microsystems", Optics and Lasers in Engineering, 2005, vol. 43, pp. 373-386.

Kim, "Effects of the Substrate Pretreatments on The Leakage Current in the Low-Temperature Poly-Si TFTs", Materials Research Society Symposium Proceedings, 1997, vol. 448, pp. 419-423.

Kondoh, "Surface treatment of sheet glass. Present status and future prospects", Journal of Non-Crystalline Solids, 1994, vol. 178, pp. 189-198.

Kucera, "Structuring of Ceramic Green Tapes by Embossing", [retrieved from the internet on Nov. 3, 2016], URL <http://www.ikts.fraunhofer.de/content/dam/ikts/en/documents/14_Structuring_ofceramicgreentapesbyembossingtcm244-102378.pdf>, pp. 28-29.

Peng, "Hybrid mold reversal imprint for three-dimensional and selective patterning", Journal of Vacuum Science and Technology B, 2006, vol. 24, No. 6, pp. 2968-2972.

Ro, "High-Modulus Spin-On Organosilicate Glasses for Nanoporous Applications", Advanced Materials, 2007, vol. 19, pp. 705-710.

Rosqvist, "Soft micromolding and lamination of piezoceramic thick films", Sensors and Actuators A, 2002, vols. 97-98, pp. 512-519.

Shan, "A micro roller embossing process for structuring large-area substrates of laminated ceramic green tapes", Microsystem Technologies, 2009, vol. 15, pp. 1319-1325.

Shaw, "Negative photoresists for optical lithography", IBM Journal of Research and Development, 1997, vol. 41, No. 1, pp. 81-94.

International Search Report for PCT International Application No. PCT/US2015/021376, dated Jun. 8, 2015, 4 pages.

U.S. Appl. No. 15/257,099, filed Sep. 6, 2016, Free.

* cited by examiner

NANOSTRUCTURES FOR COLOR-BY-WHITE OLED DEVICES

CROSS REFERENCE TO RELATED APPLICATIONS

This application is a continuation of U.S. application Ser. No. 15/126,322, filed Sep. 15, 2016, now pending, which is a 371 of PCT/US2015/021376, filed Mar. 19, 2015, which claims benefit of U.S. Provisional Application Nos. 61/955,556, filed Mar. 19, 2014 and 62/084,049, filed Nov. 25, 2014, the disclosures of which are incorporated by reference in their entireties herein.

BACKGROUND

Nanostructures and microstructures are used for a variety of applications in display, lighting, architecture and photovoltaic devices. In display devices including organic light emitting diode (OLED) devices, the structures can be used for light extraction or light distribution. In lighting devices the structures can be used for light extraction, light distribution, and decorative effects. In photovoltaic devices the structures can be used for solar concentration and antireflection. Patterning or otherwise forming nanostructures and microstructures on large substrates can be difficult and not cost-effective.

SUMMARY

The present disclosure describes nanostructured light extraction color filter laminates, and articles and methods of using nanostructured light extraction color filter laminates for the fabrication of an OLED including a nanostructure, using lamination techniques. Nanostructured OLED devices can exhibit enhanced light extraction efficiency. The methods involve transfer and/or replication of a film, layer, or coating in order to form a nanostructured surface that is in optical contact with the emitting surface of an OLED in, for example, a top emitting or a bottom emitting active matrix OLED (TE-AMOLED or BE-AMOLED) device. The articles having enhanced light extraction efficiency can be of particular use in color-by-white (CBW) OLED displays, which use white-light spectrum OLEDs with a color filter array.

In one aspect, the present disclosure provides a color-by-white (CBW) image display that includes at least one organic light emitting diode (OLED) having a top surface and capable of emitting a white color spectrum of light through the top surface; a high index optical coupling layer (OCL) in contact with the top surface, the high index OCL having a nanostructured surface opposite the top surface of the OLED; and a nanostructured template layer in contact with the nanostructured surface, the nanostructured template layer adjacent a color filter layer disposed on a substrate, wherein the index of refraction of the nanostructured template layer is lower than the index of refraction of the high index OCL.

In another aspect, the present disclosure provides a color-by-white (CBW) image display that includes at least one organic light emitting diode (OLED) having a top surface and capable of emitting a white color spectrum of light through the top surface; a high index optical coupling layer (OCL) in contact with the top surface and having a planar opposing surface; a high index nanostructured transfer layer disposed adjacent the planar opposing surface of the high index OCL, the high index nanostructured transfer layer having a nanostructured surface opposite the planar opposing surface of the high index OCL; and a nanostructured template layer in contact with the nanostructured surface, the nanostructured template layer adjacent a color filter layer disposed on a substrate, wherein the index of refraction of the nanostructured template layer is lower than the index of refraction of the high index nanostructured transfer layer.

In yet another aspect, the present disclosure provides a color-by-white (CBW) image display that includes at least one organic light emitting diode (OLED) having a top surface and capable of emitting a white color spectrum of light through the top surface; a high index optical coupling layer (OCL) in contact with the top surface and having a planar opposing surface; and an optional high index color filter planarization layer adjacent the high index OCL. The CBW image display further includes a high index color filter layer disposed on the optional high index color filter planarization layer, opposite the planar opposing surface of the high index OCL; a high index nanostructured transfer layer disposed adjacent the color filter layer, the high index nanostructured transfer layer having a nanostructured surface opposite the color filter layer; and a nanostructured template layer in contact with the nanostructured surface, the nanostructured template layer adjacent a substrate, wherein the index of refraction of the nanostructured template layer is lower than the index of refraction of the high index nanostructured transfer layer.

In yet another aspect, the present disclosure provides a color-by-white (CBW) image display that includes at least one organic light emitting diode (OLED) having a top surface, an opposing bottom surface, and capable of emitting a white color spectrum of light through the opposing bottom surface; a high index circuit planarization layer adjacent the opposing bottom surface; a high index nanostructured transfer layer in contact with the high index circuit planarization layer, the high index nanostructured transfer layer having a nanostructured surface opposite the high index circuit planarization layer; and a nanostructured template layer in contact with the nanostructured surface, the nanostructured template layer adjacent a color filter layer disposed on a substrate, wherein the index of refraction of the nanostructured template layer is lower than the index of refraction of the high index nanostructured transfer layer.

In yet another aspect, the present disclosure provides a color-by-white (CBW) image display that includes at least one organic light emitting diode (OLED) having a top surface, an opposing bottom surface, and capable of emitting a white color spectrum of light through the opposing bottom surface; a high index nanostructured transfer layer in contact with the opposing bottom surface, the high index nanostructured transfer layer having a nanostructured surface opposite the opposing bottom surface; a nanostructured template layer in contact with the nanostructured surface, the nanostructured template layer disposed on a color filter layer; and a pixel circuit planarization layer disposed between the color filter layer and a substrate, wherein the index of refraction of the nanostructured template layer is lower than the index of refraction of the high index nanostructured transfer layer.

In yet another aspect, the present disclosure provides a color-by-white (CBW) image display that includes at least one organic light emitting diode (OLED) having a top surface and capable of emitting a white color spectrum of light through the top surface; a high index optical coupling layer (OCL) in contact with the top surface and having a planar opposing surface; a high index color filter planarization layer adjacent the planar surface of the high index OCL, the high index color filter planarization layer having a nanostructured surface on a side opposite the high index OCL; and a high refractive index color filter layer disposed on the high index color filter planarization layer, opposite the planar opposing surface of the high index OCL, wherein the index of refraction of the high refractive index color filter layer≥the index of refraction of the high index color filter planarization layer≥the index of refraction of the high index OCL.

In yet another aspect, the present disclosure provides a color-by-white (CBW) image display that includes at least one organic light emitting diode (OLED) having a top surface and capable of emitting a white color spectrum of light through the top surface; a high index optical coupling layer (OCL) in contact with the top surface and having a planar opposing surface; a high index color filter planarization layer adjacent the planar opposing surface of the high index OCL; and a high refractive index color filter layer disposed on the high index color filter planarization layer, opposite the planar opposing surface of the high index OCL, the high refractive index color filter layer having a nanostructured surface on a side adjacent the high index color filter planarization layer, wherein the index of refraction of the high refractive index color filter layer≥the index of refraction of the high index color filter planarization layer≥the index of refraction of the high index OCL.

In yet another aspect, the present disclosure provides a method that includes coating an optical coupling layer (OCL) precursor on a top surface of a color-by-white (CBW) OLED array, forming a planarized OCL precursor surface; laminating a light extraction color filter laminate having a nanostructured surface onto the OCL precursor surface such that the OCL precursor at least partially fills the nanostructured surface; and polymerizing the OCL precursor to form a nanostructured high index OCL.

In yet another aspect, the present disclosure provides a method that includes coating an optical coupling layer (OCL) precursor on a top surface of a color-by-white (CBW) OLED array, forming a planarized OCL precursor surface; laminating a light extraction color filter laminate onto the OCL precursor surface such that a planar outer surface of the transfer layer of the light extraction color filter laminate contacts the OCL precursor surface, wherein the light extraction color filter laminate includes an embedded nanostructured surface; and polymerizing the OCL precursor to form a high index OCL and bond the planar outer surface of the transfer layer to the high index OCL.

In yet another aspect, the present disclosure provides a method that includes providing a light extraction color filter laminate having a substrate, a color filter array, and an exterior transfer layer having an embedded nanostructure; and forming a bottom emitting OLED array on the exterior transfer layer, in registration with the color filter array.

In yet another aspect, the present disclosure provides a light extraction color filter laminate that includes a support having a nanostructured template layer disposed on a major surface thereof, the nanostructured template layer having a nanostructured surface opposite the major surface; a high refractive index backfill layer filling the nanostructured surface and having a planar surface opposite the nanostructured surface; and a color filter array disposed on the planar surface.

In yet another aspect, the present disclosure provides a light extraction color filter laminate that includes a support having a color filter array disposed on a major surface thereof; a nanostructured template layer disposed adjacent the color filter array and having a nanostructured surface opposite the support; a high refractive index backfill layer filling the nanostructured surface and having a planar surface opposite the nanostructured surface.

In yet another aspect, the present disclosure provides a light extraction color filter laminate that includes a support having a color filter array disposed on a major surface thereof; and a nanostructured template layer disposed adjacent the color filter array and having a nanostructured surface opposite the support.

In another aspect, the present disclosure provides a color-by-white (CBW) organic light emitting diode (OLED) image display, including: an organic light emitting diode (OLED) substrate with a top surface and capable of emitting a white color spectrum of light through the top surface; a color filter substrate and an optical coupling layer (OCL). The color filter substrate includes a support substrate, a nanostructured transfer layer index-matched to the support substrate having a planar surface in contact with the support substrate and a nanostructured opposing surface, a high refractive index transfer layer planarization layer conforming to and planarizing the nanostructured surface of the transfer layer and having a planar opposing surface, a high refractive index color filter layer in contact with the planar surface of the high refractive index transfer layer planarization layer; and a high refractive index color filter planarization layer in contact with the high refractive index color filter layer. The optical coupling layer (OCL) is in contact with the OLED top surface and has a planar opposing surface that may be in contact with the high refractive index color filter planarization layer. The nanostructured surface of the transfer layer may form an interface between high index materials and low index materials.

In yet another aspect, the present disclosure provides a color-by-white (CBW) organic light emitting diode (OLED) image display, including: an organic light emitting diode (OLED) substrate with a top surface and capable of emitting a white color spectrum of light through the top surface, a color filter substrate and an optical coupling layer (OCL). The color filter substrate includes a support substrate having a planar surface, a color filter layer in contact with the planar surface of the support substrate, a nanostructured transfer layer, and a high refractive index transfer layer planarization layer conforming to and planarizing the nanostructured surface of the transfer layer and having a planar opposing surface. The optical coupling layer (OCL) is in contact with the OLED top surface and has a planar opposing surface that may be in contact with the transfer layer planarization layer. The nanostructured surface of the transfer layer may form an interface between high index materials and low index materials.

In yet another aspect, the present disclosure provides a color-by-white (CBW) organic light emitting diode (OLED) image display, including: an organic light emitting diode (OLED) substrate with a top surface and capable of emitting a white color spectrum of light through the top surface, a color filter substrate and an optical coupling layer (OCL). The color filter substrate includes a support substrate having a planar surface, a color filter layer having a planar surface in contact with the planar surface of the support substrate having a planar surface and a nanostructured opposing surface; and a high refractive index color filter layer planarization layer or a high refractive index transfer layer planarization layer, in contact with the color filter layer conforming to and planarizing the nanostructured surface of the color filter layer and having a planar opposing surface. The optical coupling layer (OCL) is in contact with the OLED top surface and has a planar opposing surface that may be in contact with the transfer layer planarization layer.

The nanostructured surface of the color filter layer may form an interface between high index materials and low index materials.

In yet another aspect, the present disclosure provides a color-by-white (CBW) organic light emitting diode (OLED) image display, including: an organic light emitting diode (OLED) substrate with a top surface and capable of emitting a white color spectrum of light through the top surface, a color filter substrate and an optical coupling layer (OCL). The color filter substrate includes a support substrate having a planar surface, a color filter layer in contact with the planar surface of the support substrate and a nanostructured transfer layer. The optical coupling layer (OCL) is in contact with the OLED top surface and has an opposing textured surface conforming to the nanostructured surface of the transfer layer. The nanostructured surface of the transfer layer may form an interface between high index materials and low index materials. Optionally, the color filter substrate may further include a color filter planarization layer disposed between the color filter layer and the nanostructured transfer layer. In yet another aspect, the present disclosure provides a color-by-white (CBW) organic light emitting diode (OLED) image display, including: an organic light emitting diode (OLED) substrate with a bottom surface capable of emitting a white color spectrum of light through the bottom surface, the OLED substrate including a color filter substrate and an OLED sub-structure. The color filter substrate includes a OLED support having a planar surface, a color filter layer in contact with the planar surface of the OLED support, a nanostructured transfer layer, index-matched to the color filter planarization layer, having a planar surface in contact with the color filter layer and a nanostructured opposing surface, and a high refractive index transfer layer planarization layer conforming to and planarizing the nanostructured surface of the transfer layer and having a planar opposing surface. The OLED sub-structure includes a pixel circuitry disposed on the planar surface of high refractive index transfer layer planarization layer, a pixel circuit planarization layer initially disposed on an covering at least a portion of the planar surface of high refractive index transfer layer planarization layer and pixel circuitry, at least one via passing through the pixel circuit planarization layer, at least one bottom electrode disposed on a portion of the pixel circuit planarization layer, a pixel defining layer disposed on the pixel circuit planarization layer and a portion of each of the at least one bottom electrode, an OLED capable of emitting white color spectrum of light, disposed on the at least one bottom electrode and a portion of the pixel defining layer, a transparent top electrode disposed on the OLED and the pixel defining layer, and an optional thin film encapsulation layer disposed on the transparent top electrode. The at least one via provides an electrical connection to the at least one bottom electrode.

In yet another aspect, the present disclosure provides a color filter substrate for a color-by-white (CBW) organic light emitting diode (OLED) image display, including: an OLED support having a planar surface, pixel circuitry disposed on the OLED support, a pixel circuit planarization layer having a planar surface and initially disposed on and covering at least a portion of the planar surface OLED support and pixel circuitry, a color filter layer in contact with the planar surface of the pixel circuit planarization layer, a nanostructured transfer layer index-matched to the color filter planarization layer having a planar surface in contact with the color filter layer and a nanostructured opposing surface, and a high refractive index transfer layer planarization layer conforming to and planarizing the nanostructured surface of the transfer layer and having a planar opposing surface.

In yet another aspect, the present disclosure provides a color-by-white (CBW) organic light emitting diode (OLED) image display, including: an organic light emitting diode (OLED) substrate with a bottom surface capable of emitting a white color spectrum of light through the bottom surface, the OLED substrate including a color filter substrate and an OLED sub-structure. The color filter substrate includes: an OLED support having a planar surface, pixel circuitry disposed on the OLED support, a pixel circuit planarization layer having a planar surface and initially disposed on and covering at least a portion of the planar surface OLED support and pixel circuitry, a color filter layer in contact with the planar surface of the pixel circuit planarization layer, a nanostructured transfer layer index-matched to the color filter planarization layer having a planar surface in contact with the color filter layer and a nanostructured opposing surface, and a high refractive index transfer layer planarization layer conforming to and planarizing the nanostructured surface of the transfer layer and having a planar opposing surface. The OLED sub-structure includes at least one via passing through the high refractive index transfer layer planarization layer, a nanostructured transfer layer, a color filter layer and pixel circuit planarization layer, at least one bottom electrode deposited over a portion of high refractive index transfer layer planarization layer, a pixel defining layer disposed on the pixel circuit planarization layer and a portion of each bottom electrode, an OLED capable of emitting white color spectrum of light disposed on the bottom electrode and a portion of the pixel defining layer, a transparent top electrode disposed on the OLED and pixel defining layer, and an optional thin film encapsulation layer disposed on the transparent top electrode. The at least one via provides an electrical connection to the at least one bottom electrode.

In another aspect, the present disclosure provides a light extraction color filter laminate, including: a support substrate, a nanostructured transfer layer index-matched to the support substrate having a planar surface in contact with the support substrate and a nanostructured opposing surface, a high refractive index transfer layer planarization layer conforming to and planarizing the nanostructured surface of the transfer layer and having a planar opposing surface, a high refractive index color filter layer in contact with the planar surface of the high refractive index transfer layer planarization layer, and a high refractive index color filter planarization layer in contact with the high refractive index color filter layer.

In yet another aspect, the present disclosure provides a light extraction color filter laminate, including: a support substrate having a planar surface, a color filter layer in contact with the planar surface of the support substrate, a nanostructured transfer layer, having a planar surface and a nanostructured opposing surface, and a high refractive index transfer layer planarization layer conforming to and planarizing the nanostructured surface of the transfer layer and having a planar opposing surface. The light extraction color filter laminate may further include a color filter planarization layer disposed between the color filter layer and the nanostructured transfer layer, wherein the nanostructured transfer layer is index-matched to the color filter planarization layer.

In yet another aspect, the present disclosure provides a light extraction color filter laminate, including: a support substrate having a planar surface, a color filter layer in contact with the planar surface of the support substrate, and a nanostructured transfer layer having a planar surface in contact with the color filter planarization layer and a nanostructured opposing surface. The light extraction color filter laminate may further include a color filter planarization layer disposed between the color filter layer and the nanostructured transfer layer, wherein the nanostructured transfer layer is index-matched to the color filter planarization layer.

The light extraction color filter laminates may further include an auxiliary layer. The auxiliary layer may be a transparent conductive oxide.

In another aspect, the present disclosure provides a method of making a color-by-white (CBW) organic light emitting diode (OLED) image display, including: coating an optical coupling layer (OCL) precursor on a top surface of a color-by-white (CBW) OLED array, forming a planarized OCL precursor surface, laminating a light extraction color filter laminate having a nanostructured surface onto the OCL precursor surface such that the OCL precursor at least partially fills the nanostructured surface, and polymerizing the OCL precursor to form a nanostructured high index OCL. In the method of making a color-by-white (CBW) organic light emitting diode (OLED) image display, polymerizing may include actinic radiation curing, thermal curing, or a combination thereof. In the method of making a color-by-white (CBW) organic light emitting diode (OLED) image display, the actinic radiation may include ultraviolet radiation or electron beam radiation. In the method of making a color-by-white (CBW) organic light emitting diode (OLED) image display, the light extraction color filter laminate may include a color filter array. In the method of making a color-by-white (CBW) organic light emitting diode (OLED) image display, the light extraction color filter laminate may include a glass substrate. In the method of making a color-by-white (CBW) organic light emitting diode (OLED) image display, the top surface of the CBW OLED array may include an adhesion promoting primer.

In yet another aspect, the present disclosure provides a method of making a color-by-white (CBW) organic light emitting diode (OLED) image display, including: coating an optical coupling layer (OCL) precursor on a top surface of a color-by-white (CBW) OLED array, forming a planarized OCL precursor surface, laminating a light extraction color filter laminate onto the OCL precursor surface such that a planar outer surface of the transfer layer of the light extraction color filter laminate contacts the OCL precursor surface, wherein the light extraction color filter laminate includes an embedded nanostructured surface, and polymerizing the OCL precursor to form a high index OCL and bond the planar outer surface of the transfer layer to the high index OCL. In the method of making a color-by-white (CBW) organic light emitting diode (OLED) image display, polymerizing may include actinic radiation curing, thermal curing, or a combination thereof. In the method of making a color-by-white (CBW) organic light emitting diode (OLED) image display, the actinic radiation may include ultraviolet radiation or electron beam radiation. In the method of making a color-by-white (CBW) organic light emitting diode (OLED) image display, the light extraction color filter laminate may include a color filter array. In the method of making a color-by-white (CBW) organic light emitting diode (OLED) image display, the light extraction color filter laminate may include a glass substrate. In the method of making a color-by-white (CBW) organic light emitting diode (OLED) image display, at least one of the top surface of the OLED array, the planarized OCL precursor, and the planar outer surface, may include an adhesion promoting primer.

In yet another aspect, the present disclosure provides a method of making a color-by-white (CBW) organic light emitting diode (OLED) image display, including: providing a light extraction color filter laminate having a substrate, a color filter array, and an exterior transfer layer having an embedded nanostructure; and forming a bottom emitting OLED array on the exterior transfer layer, in registration with the color filter array.

The above summary is not intended to describe each disclosed embodiment or every implementation of the present disclosure. The figures and the detailed description below more particularly exemplify illustrative embodiments.

BRIEF DESCRIPTION OF THE DRAWINGS

Throughout the specification reference is made to the appended drawings, where like reference numerals designate like elements, and wherein.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1A:
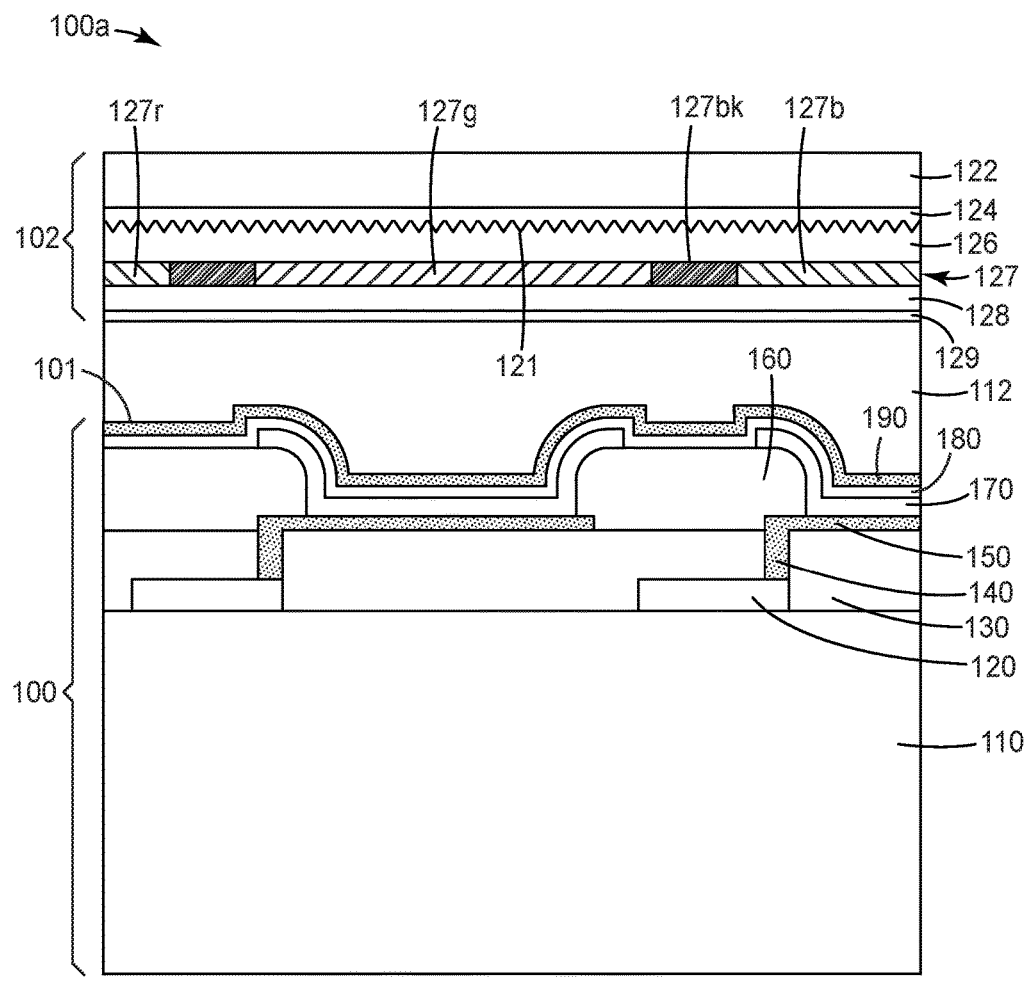
FIG. 1A shows a schematic cross-section view of portion of a nanostructured TE CBW AMOLED device.

Examples of color-by-white OLED devices are disclosed in U.S. Pat. No. 9,997,573, which is incorporated herein by reference as if fully set forth.

The present disclosure describes nanostructured light extraction color filter laminates, and articles and methods of using nanostructured light extraction color filter laminates for the fabrication of an OLED including a nanostructure, using lamination techniques. Nanostructured OLED devices can exhibit enhanced light extraction efficiency. The methods involve transfer and/or replication of a film, layer, or coating in order to form a nanostructured surface that is in optical contact with the emitting surface of an OLED in, for example, a top emitting or a bottom emitting active matrix OLED (TE-AMOLED or BE-AMOLED) device. The articles having enhanced light extraction efficiency can be of particular use in color-by-white (CBW) OLED displays, which use white-light spectrum OLEDs with a color filter array to produce a full-color display.

The resulting nanostructured OLED exhibits improved outcoupling of light emitted from the device and in a thin, easy to fabricate design. One particular advantage of the described methods is that it allows nanopatterning of a finished device without the solvent steps that can be required for traditional photolithographic patterning of nanostructures, including, for example, resist coating, resist developing, and resist stripping steps.

In the following description, reference is made to the accompanying drawings that forms a part hereof and in which are shown by way of illustration. It is to be understood that other embodiments are contemplated and may be made without departing from the scope or spirit of the present disclosure. The following detailed description, therefore, is not to be taken in a limiting sense.

All scientific and technical terms used herein have meanings commonly used in the art unless otherwise specified. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

As used in this specification and the appended claims, the singular forms "a," "an," and "the" encompass embodiments having plural referents, unless the content clearly dictates otherwise. As used in this specification and the appended claims, the term "or" is generally employed in its sense including "and/or" unless the content clearly dictates otherwise.

Spatially related terms, including but not limited to, "lower," "upper," "beneath," "below," "above," and "on top," if used herein, are utilized for ease of description to describe spatial relationships of an element(s) to another. Such spatially related terms encompass different orientations of the device in use or operation in addition to the particular orientations depicted in the figures and described herein. For example, if an object depicted in the figures is turned over or flipped over, portions previously described as below or beneath other elements would then be above those other elements.

As used herein, when an element, component or layer for example is described as forming a "coincident interface" with, or being "on" "connected to," "coupled with" or "in contact with" another element, component or layer, it can be directly on, directly connected to, directly coupled with, in direct contact with, or intervening elements, components or layers may be on, connected, coupled or in contact with the particular element, component or layer, for example. When an element, component or layer for example is referred to as being "directly on," "directly connected to," "directly coupled with," or "directly in contact with" another element, there are no intervening elements, components or layers for example.

As used herein, "have", "having", "include", "including", "comprise", "comprising" or the like are used in their open ended sense, and generally mean "including, but not limited to." It will be understood that the terms "consisting of" and "consisting essentially of" are subsumed in the term "comprising," and the like.

The term "OLED" refers to an organic light emitting device. OLED devices include a thin film of electroluminescent organic material sandwiched between a cathode and an anode, with one or both of these electrodes being a transparent conductor. When a voltage is applied across the device, electrons and holes are injected from their respective electrodes and recombine in the electroluminescent organic material through the intermediate formation of emissive excitons. The term "AMOLED" refers to an active matrix OLED, and the techniques described herein can generally be applied to both OLED devices and AMOLED devices.

A "structured optical film" refers to a film or layer that improves light outcoupling from an OLED device and/or improves angular luminance or/and color uniformity of the OLED. The light extraction function and angular luminance/color improvement function can also be combined in one structured film. A structured optical film can include periodic, quasi-periodic or random engineered nanostructures (e.g., light extraction film, described below), and/or it can include periodic, quasi-periodic or random engineered microstructures with structured feature size of equal or higher than 1 um.

The terms "nanostructure" or "nanostructures" refers to structures having at least one dimension (e.g., height, length, width, or diameter) of less than 2 micrometers and more preferably less than one micrometer. Nanostructure includes, but is not necessarily limited to, particles and engineered features. The particles and engineered features can have, for example, a regular or irregular shape. Such particles are also referred to as nanoparticles. The term "nanostructured" refers to a material or layer having nanostructures, and the term "nanostructured AMOLED device" means an AMOLED device that incorporates nanostructures.

The term "actinic radiation" refers to wavelengths of radiation that can crosslink or cure polymers and can include ultraviolet, visible, and infrared wavelengths and can include digital exposures from rastered lasers, thermal digital imaging, and electron beam scanning.

"High index" or "high refractive index" refers to a material, layer or coating having an index of refraction of from about 1.65 to about 2.20. A particularly useful range for a high index or high refractive index material, layer or coating is from about 1.65 to about 2.0. In some embodiments, the term "high index" or "high refractive index" refers to a material, layer, or coating having an index of refraction of about 1.7, and generally distinguished from typical polymeric or glassy materials which have an index of refraction of about 1.5. "Low index" or "low refractive index" refers to a material, layer or coating having an index of refraction of from about 1.30 to less than about 1.65. A particularly useful range for a low index or low refractive index material, layer or coating is from about 1.40 to about 1.55.

Nanostructured light extraction color filter laminates and methods are described that enable the fabrication of OLEDs having nanostructured solid surfaces, using lamination techniques. The methods involve transfer and/or replication of a film, layer, or coating in order to form a nanostructured optical coupling layer (OCL) designed to improve light extraction efficiency from emissive devices. Lamination transfer films, patterned structured tapes, and methods of using nanostructured tapes useful in the present disclosure have been described, for example, in U.S. Pat. Nos. 9,780, 335; 9,711,744; and U.S. Patent Publication Nos. 2014/0175707 and 2016/0268553.

In some embodiments, a photocurable prepolymer solution, typically photocurable upon exposure to actinic radiation (typically ultraviolet radiation) can be cast against a microreplicated master and then exposed to actinic radiation while in contact with the microreplicated master to form the template layer. The photocurable prepolymer solution can be cast onto the surface of an OLED device before, during, and even sometimes after, being photopolymerized while in contact with a microreplicated master.

In some embodiments, a nanostructure may be imparted directly on the surface of the red, green, or blue color filters or the color filter planarization layer by methods known in the art to produce such structures. Methods include, but are not limited to, e-beam photolithography, "soft lithographic techniques" such as nanoimprint lithography, laser interference lithography, nanosphere lithography, and block copolymer lithography.

The nanostructures imparted directly on the surface of the red, green, or blue color filters or the color filter planarization layer may also be formed by a sputter/etch or reactive ion etching process described in one or more of: WO2013148031 entitled "NANOSTRUCTURED MATERIAL AND METHOD OF MAKING THE SAME"; WO201325614 entitled "NANO STRUCTURED ARTICLES AND METHODS TO MAKE THE SAME"; US20130344290 entitled "NANOSTRUCTURED ARTICLES"; US20140004304 entitled "MULTILAYER NANOSTRUCTURED ARTICLES"; US20130038949 entitled "METHOD OF MAKING A NANOSTRUCTURE"; US20120328829 entitled "COMPOSITE WITH NANO-STRUCTURED LAYER"; US20110281068 entitled "NANOSTRUCTURED ARTICLES AND METHODS OF MAKING NANOSTRUCTURED ARTICLES"; US20120012557 entitled "METHOD FOR MAKING NANOSTRUCTURED SURFACES"; US20090263668 entitled "DURABLE COATING OF AN OLIGOMER AND METHODS OF APPLYING"; or US20100239783 entitled "METHODS OF FORMING MOLDS AND METHODS OF FORMING ARTICLES USING SAID MOLDS".

The structured optical film or a non-polarization preserving element described herein can be a separate film applied to an OLED device. For example, an optical coupling layer (OCL) can be used to optically couple the structured optical film or a non-polarization preserving element to a light output surface of an OLED device. The optical coupling layer can be applied to the structured optical film or a non-polarization preserving element, the OLED device, or both, and it can be implemented with an adhesive to facilitate application of the structured optical film or a non-polarization preserving element to the OLED device. Examples of optical coupling layers and processes for using them to laminate light extraction films to OLED devices are described in U.S. Pat. No. 8,692,446, which is incorporated herein by reference as if fully set forth.

The Optical Coupling Material/layer can be used as an interlayer/"adhesive" between OLED devices and extraction elements (nanoparticles and periodic structure). It can help in out-coupling light modes from the light source (OLEDs) to the nano-structured film to enhance light output. The materials for optical coupling layer preferably have a high index of refraction, at least 1.65 or 1.70 or even up to 2.2, comparable to that of OLED organic and inorganic layers (e.g., indium tin oxide (ITO). The OCL can be optionally cured using UV or thermal curing methods, although UV curing can be preferred. The material could be 100 percent pure resin such as, for example a high refractive index Acryl Resin #6205 having n>1.7 (available from NTT Advanced Technology, Tokyo, JP) or a mixture of surface modified high index particles ($TiO_2$ or $ZrO_2$) dispersed in a resin system such as that described in U.S. Patent Publication 2002/0329959. The OCL can be used within a range of various thicknesses depending upon, for example, a desired construction of the corresponding OLED and color filter.

The nanostructures for the structured optical film or a non-polarization preserving element (e.g., light extraction film) can be formed integrally with the substrate or in a layer applied to the substrate. For example, the nanostructures can be formed on the substrate by applying to the substrate a material and subsequently structuring the material. Nanostructures are structures having at least one dimension, such as width, less than about 2 microns, or even less than about 1 micron.

Nanostructure includes, but is not necessarily limited to, particles and engineered features. The particles and engineered features can have, for example, a regular or irregular shape. Such particles are also referred to as nanoparticles. Engineered nanostructures are not individual particles but may comprise nanoparticles forming the engineered nanostructures where the nanoparticles are significantly smaller than the overall size of the engineered structures.

The nanostructures for a structured optical film or a non-polarization preserving element (e.g., light extraction film) can be one-dimensional (1D), meaning they are periodic in only one dimension, that is, nearest-neighbor features are spaced equally in one direction along the surface, but not along the orthogonal direction. In the case of 1D periodic nanostructures, the spacing between adjacent periodic features is less than 2 microns and can even be less than 1 micron. One-dimensional structures include, for example, continuous or elongated prisms or ridges, or linear gratings.

The nanostructures for a structured optical film or a non-polarization preserving element (e.g., light extraction film) can also be two-dimensional (2D), meaning they are periodic in two dimensions, that is, nearest neighbor features are spaced equally in two different directions along the surface. In the case of 2D nanostructures, the spacing in both directions is less than 1 micron. Note that the spacing in the two different directions may be different. Two-dimensional structures include, for example, diffractive optical structures, pyramids, trapezoids, round or square shaped posts, or photonic crystal structures. Other examples of two-dimensional structures include curved sided cone structures as described in U.S. Pat. Application Publication No. 2010/0128351, which is incorporated herein by reference as if fully set forth.

Materials for the substrates, multi-periodic structures, and transfer layers for light extraction film are provided in the published patent applications identified above. For example, the substrate can be implemented with glass, PET, polyimides, TAC, PC, polyurethane, PVC, or flexible glass. Processes for making light extraction film are also provided in the published patent applications identified above. Optionally, the substrate can be implemented with a barrier film to protect a device incorporating the light extraction film from moisture or oxygen. Examples of barrier films are disclosed in U.S. Patent Publication No. 2007/0020451 and U.S. Pat. No. 7,468,211, both of which are incorporated herein by reference as if fully set forth.

FIG. 1A shows a schematic cross-section view of portion of a nanostructured TE CBW AMOLED device 100a, according to one aspect of the disclosure. The nanostructured TE CBW AMOLED device 100a includes a TE AMOLED 100 having an OLED support 110, pixel circuitry 120 disposed on the OLED support 110, and a pixel circuit planarization layer 130 initially deposited covering the entire OLED support 110 and pixel circuitry 120, as known to those of skill in the art. TE AMOLED 100 further includes at least one via 140 passing through the pixel circuit planarization layer 130 providing an electrical connection to at least one bottom electrode 150 deposited over a portion of the pixel circuit planarization layer 130. A pixel defining layer 160 is deposited over the pixel circuit planarization layer 130 and a portion of each bottom electrode 150 to define and electrically isolate individual pixels. An OLED 170 having a plurality of known layers (not shown) that is capable of emitting white color spectrum of light, is deposited over the bottom electrode 150 and a portion of the pixel defining layer 160, a transparent top electrode 180 is deposited over the OLED 170 and pixel defining layer 160, and an optional thin film encapsulation layer 190 is deposited to protect the moisture and oxygen sensitive device from the environment and also from any subsequent processing steps. Layer 190 can be made by the techniques described in, for example, U.S. Pat. No. 7,510,913.

The nanostructured TE CBW AMOLED device 100a further includes a high index polymeric optical coupling layer (OCL) 112 disposed on a top surface 101 of the TE AMOLED 100 (i.e., on top of the thin film encapsulation layer 190), and includes a planar surface opposite the TE AMOLED 100. A light extraction color filter laminate 102 including a substrate 122 is laminated and affixed to the high index OCL 112 such that the substrate 122 and the OLED support 110 define the exterior surfaces of the TE CBW AMOLED device 100a, and encapsulate the moisture and oxygen sensitive device elements from the environment. In some cases, the high index OCL 112 can instead be included as the top surface of the light extraction color filter laminate 102 that can then be laminated and affixed to the thin film encapsulation layer 190, as described elsewhere.

Light extraction color filter laminate 102 includes the substrate 122 having a nanostructured template layer 124 that includes a nanostructured surface 121 opposite the substrate 122. A high refractive index backfill layer 126 (also referred to as a high index nanostructured transfer layer 126) is deposited onto the nanostructured surface 121 forming a planar surface onto which a high index color filter array 127 is deposited. The high index color filter array 127 includes red filters 127r, green filters 127g, blue filters 127b, and black matrix 127bk separating adjacent color filters, as known to one of skill in the art. Each of the red, green, and blue filters (127r, 127g, 127b) are disposed in registration with individual OLED subpixels. An optional high index color filter planarization layer 128 provides a planar top surface of the light extraction color filter laminate 102 that can be laminated to the high index OCL 112 adjacent the top surface 101 of the TE AMOLED 100, as described elsewhere. In one particular embodiment, the optional high index color filter planarization layer 128 can comprise the same material as the high index OCL 112. An optional auxiliary layer 129 can be disposed between the optional high index color filter planarization layer 128 and the high index OCL 112 or disposed anywhere between layers 112 and 127; in some cases the optional auxiliary layer 129 can include, for example, a transparent conducting oxide (TCO) such as indium tin oxide (ITO). The optional auxiliary layer 129 can be disposed on the top surface of either the light extraction color filter laminate 102 or the high index OCL 112 prior to lamination of the two films.

In some cases, the index of refraction of the high index nanostructured transfer layer 126 can be greater than or preferably equal to the index of refraction of the high index color filter array 127, which can be greater than or equal to the index of refraction of the optional high index color filter planarization layer 128, which can be greater than the index of refraction of the high index OCL 112 for efficient extraction of light from the TE CBW AMOLED device 100a. In one particular embodiment, at least two of the high index nanostructured transfer layer 126, the optional high index color filter planarization layer 128, and the high index OCL 112 can comprise the same material.

The nanostructured TE CBW AMOLED device 100a can be made by the techniques described in co-pending U.S. Patent Publication No. 2016/0268553, the entire disclosure of which is hereby included by reference. Generally, the technique includes a step of coating an OCL precursor on a top surface 101 of the TE AMOLED 100 array, thereby forming a planarized OCL precursor surface. Then, a light extraction color filter laminate 102 is laminated onto the OCL precursor surface such that a planar outer surface of the light extraction color filter laminate 102 contacts the OCL precursor surface, wherein the light extraction color filter laminate 102 includes an embedded nanostructured surface 121. Then, the OCL precursor is polymerized to form the high index OCL 112 and bond the planar outer surface of the light extraction color filter laminate 102 to the high index OCL 112. The light extraction color filter laminate 102 and the OCL precursor can both include a polymerizable composition comprising monomers which are cured using actinic radiation, e.g., visible light, ultraviolet radiation, electron beam radiation, heat and combinations thereof.

Figure 1B:
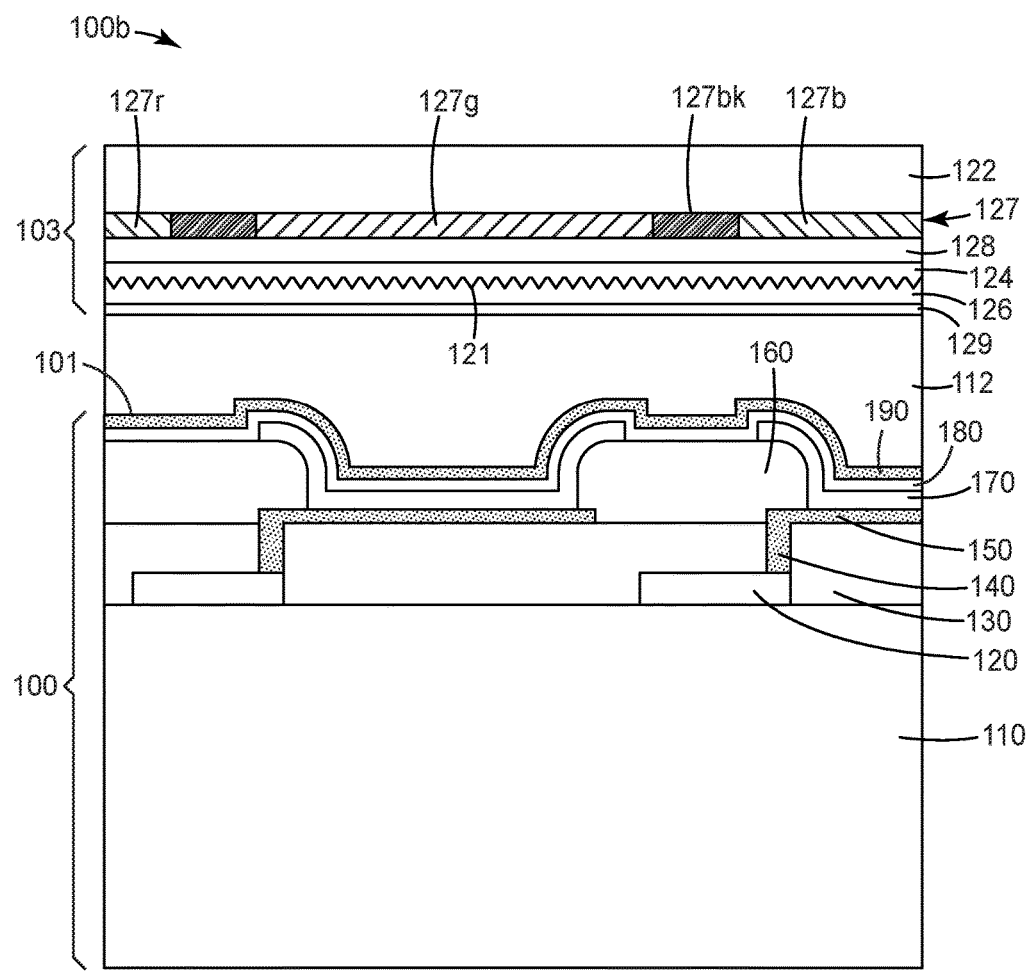
FIG. 1B shows a schematic cross-section view of portion of a nanostructured TE CBW AMOLED device.

FIG. 1B shows a schematic cross-section view of portion of a nanostructured TE CBW AMOLED device 100b, according to one aspect of the disclosure. The nanostructured TE CBW AMOLED device 100b includes a TE AMOLED 100 having an OLED support 110, pixel circuitry 120 disposed on the OLED support 110, and a pixel circuit planarization layer 130 initially deposited covering the entire OLED support 110 and pixel circuitry 120, as known to those of skill in the art. TE AMOLED 100 further includes at least one via 140 passing through the pixel circuit planarization layer 130 providing an electrical connection to at least one bottom electrode 150 deposited over a portion of the pixel circuit planarization layer 130. A pixel defining layer 160 is deposited over the pixel circuit planarization layer 130 and a portion of each bottom electrode 150 to define and electrically isolate individual pixels. An OLED 170 having a plurality of known layers (not shown) that is capable of emitting white color spectrum of light, is deposited over the bottom electrode 150 and a portion of the pixel defining layer 160, a transparent top electrode 180 is deposited over the OLED 170 and pixel defining layer 160, and an optional thin film encapsulation layer 190 is deposited to protect the moisture and oxygen sensitive device from the environment and also from any subsequent processing steps.

The nanostructured TE CBW AMOLED device 100b further includes a high index polymeric optical coupling layer (OCL) 112 disposed on a top surface 101 of the TE AMOLED 100 (i.e., on top of the thin film encapsulation layer 190), and includes a planar surface opposite the TE AMOLED 100. A light extraction color filter laminate 103 including a substrate 122 is laminated and affixed to the high index OCL 112 such that the substrate 122 and the OLED support 110 define the exterior surfaces of the TE CBW AMOLED device 100b, and encapsulate the moisture and oxygen sensitive device elements from the environment. In some cases, the high index OCL 112 can instead be included as the top surface of the light extraction color filter laminate 102 that can then be laminated and affixed to the thin film encapsulation layer 190, as described elsewhere.

Light extraction color filter laminate 103 includes the substrate 122 having color filter array 127 disposed on a surface thereof. The color filter array 127 includes red filters 127r, green filters 127g, blue filters 127b, and black matrix 127bk separating adjacent color filters, as known to one of skill in the art. Each of the red, green, and blue filters (127r, 127g, 127b) are disposed in registration with individual OLED subpixels. An optional color filter planarization layer 128 provides a planar top surface onto which a nanostructured template layer 124 that includes a nanostructured surface 121 opposite the substrate 122 can be disposed. A high refractive index backfill layer 126 (also referred to as a high index nanostructured transfer layer 126) is deposited onto the nanostructured surface 121 forming a planar surface of the light extraction color filter laminate 103 that can be laminated to the high index OCL 112 adjacent the top surface 101 of the TE AMOLED 100, as described elsewhere. An optional auxiliary layer 129 can be disposed between the high index nanostructured transfer layer 126 and the high index OCL 112; in some cases the optional auxiliary layer 129 can include, for example, a transparent conducting oxide (TCO) such as indium tin oxide (ITO). The optional auxiliary layer 129 can be disposed on the top surface of either the light extraction color filter laminate 103 or the high index OCL 112 prior to lamination of the two films.

In some cases, the index of refraction of the high index nanostructured transfer layer 126 can be preferably equal to the index of refraction of the high index OCL 112 for efficient extraction of light from the TE CBW AMOLED device 100b. In one particular embodiment, both the high index nanostructured transfer layer 126 and the high index OCL 112 can comprise the same material.

The nanostructured TE CBW AMOLED device 100b can be made by the techniques described in co-pending U.S. Patent Publication No. 2016/0268553, the entire disclosure of which is hereby included by reference. Generally, the technique includes a step of coating an OCL precursor on a top surface 101 of the TE AMOLED 100 array, thereby forming a planarized OCL precursor surface. Then, a light extraction color filter laminate 103 is laminated onto the OCL precursor surface such that a planar outer surface of the light extraction color filter laminate 103 contacts the OCL precursor surface, wherein the light extraction color filter laminate 103 includes an embedded nanostructured surface 121. Then, the OCL precursor is polymerized to form the high index OCL 112 and bond the planar outer surface of the light extraction color filter laminate 103 to the high index OCL 112. The light extraction color filter laminate 103 and the OCL precursor can both include a polymerizable composition comprising monomers which are cured using actinic radiation, e.g., visible light, ultraviolet radiation, electron beam radiation, heat and combinations thereof.

Figure 1C:
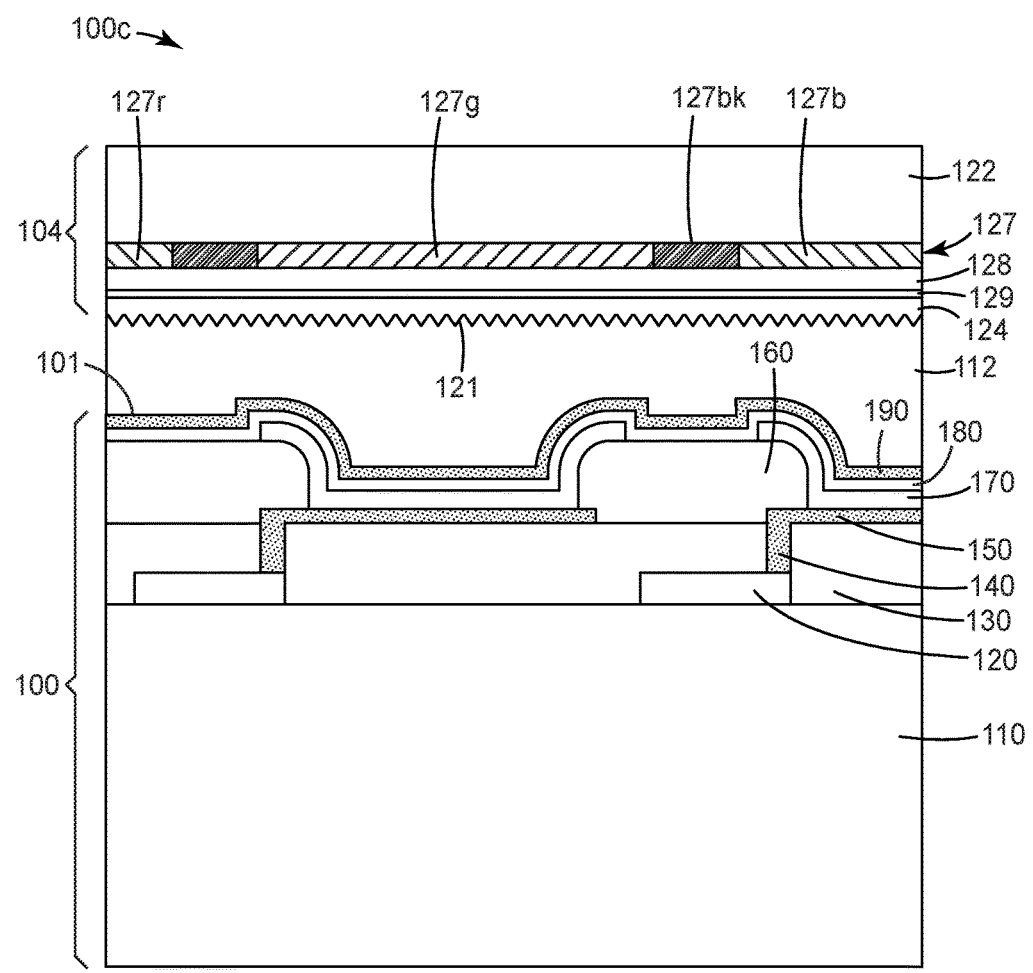
FIG. 1C shows a schematic cross-section view of portion of a nanostructured TE CBW AMOLED device.

FIG. 1C shows a schematic cross-section view of portion of a nanostructured TE CBW AMOLED device 100c, according to one aspect of the disclosure. The nanostructured TE CBW AMOLED device 100c includes a TE AMOLED 100 having an OLED support 110, pixel circuitry 120 disposed on the OLED support 110, and a pixel circuit planarization layer 130 initially deposited covering the entire OLED support 110 and pixel circuitry 120, as known to those of skill in the art. TE AMOLED 100 further includes at least one via 140 passing through the pixel circuit planarization layer 130 providing an electrical connection to at least one bottom electrode 150 deposited over a portion of the pixel circuit planarization layer 130. A pixel defining layer 160 is deposited over the pixel circuit planarization layer 130 and a portion of each bottom electrode 150 to define and electrically isolate individual pixels. An OLED 170 having a plurality of known layers (not shown) that is capable of emitting white color spectrum of light, is deposited over the bottom electrode 150 and a portion of the pixel defining layer 160, a transparent top electrode 180 is deposited over the OLED 170 and pixel defining layer 160, and an optional thin film encapsulation layer 190 is deposited to protect the moisture and oxygen sensitive device from the environment and also from any subsequent processing steps.

The nanostructured TE CBW AMOLED device 100c further includes a high index polymeric optical coupling layer (OCL) 112 disposed on a top surface 101 of the TE AMOLED 100 (i.e., on top of the thin film encapsulation layer 190), and includes a planar surface opposite the TE AMOLED 100. A light extraction color filter laminate 104 including a substrate 122 is laminated and affixed to the high index OCL 112 such that the substrate 122 and the OLED support 110 define the exterior surfaces of the TE CBW AMOLED device 100c, and encapsulate the moisture and oxygen sensitive device elements from the environment. In some cases, the high index OCL 112 can instead be included as the top surface of the light extraction color filter laminate 102 that can then be laminated and affixed to the thin film encapsulation layer 190, as described elsewhere.

Light extraction color filter laminate 104 includes the substrate 122 having color filter array 127 disposed on a surface thereof. The color filter array 127 includes red filters 127r, green filters 127g, blue filters 127b, and black matrix 127bk separating adjacent color filters, as known to one of skill in the art. Each of the red, green, and blue filters (127r, 127g, 127b) are disposed in registration with individual OLED subpixels. An optional color filter planarization layer 128 provides a planar top surface onto which a nanostructured template layer 124 that includes a nanostructured surface 121 opposite the substrate 122 can be disposed. In some cases, the optional color filter planarization layer 128 and the nanostructured template layer 124 can be comprised of the same material, so that the index of refraction of each layer is the same. The nanostructured template layer 124 is laminated and affixed to the high index OCL 112 adjacent the top surface 101 of the TE AMOLED 100 such that the high index OCL 112 fills the nanostructured surface 121, as described elsewhere. An optional auxiliary layer 129 can be disposed between the nanostructured template layer 124 and the optional color filter planarization layer 128; in some cases the optional auxiliary layer 129 can include, for example, a transparent conducting oxide (TCO) such as indium tin oxide (ITO).

The nanostructured TE CBW AMOLED device 100c can be made by the techniques described in co-pending U.S. Patent Publication No. 2016/0268553, the entire disclosure of which is hereby included by reference. Generally, the technique includes a step of coating an OCL precursor on a top surface 101 of the TE AMOLED 100 array, thereby forming a planarized OCL precursor surface. Then, a light extraction color filter laminate 104 having a nanostructured surface 121 is laminated onto the OCL precursor surface such that the nanostructured surface 121 of the light extraction color filter laminate 104 is embossed into the OCL precursor surface. Then, the OCL precursor is polymerized to form the high index OCL 112 and bond the nanostructured surface 121 of the light extraction color filter laminate 104 to the high index OCL 112. The light extraction color filter laminate 104 and the OCL precursor can both include a polymerizable composition comprising monomers which are cured using actinic radiation, e.g., visible light, ultraviolet radiation, electron beam radiation, heat and combinations thereof.

In one particular embodiment, OLED extraction structures may be used to control the light distribution pattern of the device. OLEDs lacking a microcavity in the OLED optical stack may be Lambertian emitters, with a light distribution pattern that is smooth and evenly distributed over a hemisphere. However, the light distribution pattern of commercially available TE AMOLED displays usually exhibit characteristics of a microcavity in the optical stack. These characteristics include a narrower and less uniform angular light distribution and significant angular color variation. For OLED displays, it may be desirable to tailor the light distribution with nanostructures, using the methods disclosed herein. The nanostructures may function to improve light extraction, to redistribute the emitted light, or both. Structures can also be useful on the external surface of an OLED substrate to extract light into air that is trapped in substrate total internal reflection modes. External extraction structures can include microlens arrays, microfresnel arrays, or other refractive, diffractive, or hybrid optical elements.

The TE AMOLED 100 can be a receptor substrate for the high index OCL 112, and formed of organic semiconductor materials on a support, such as a support wafer. The dimensions of these receptor substrates can exceed those of a semiconductor wafer master template. Currently, the largest wafers in production have a diameter of 300 mm. Light extraction color filter laminates produced using the method disclosed herein can be made with a lateral dimension of greater than 1000 mm and a roll length of hundreds of meters. In some embodiments, the receptor substrates can have dimensions of about 620 mm×about 750 mm, of about 680 mm×about 880 mm, of about 1100 mm×about 1300 mm, of about 1300 mm×about 1500 mm, of about 1500 mm×about 1850 mm, of about 1950 mm×about 2250 mm, or about 2200 mm×about 2500 mm, or even larger. For long roll lengths, the lateral dimensions can be greater than about 750 mm, greater than about 880 mm, greater than about 1300 mm, greater than about 1500 mm, greater than about 1850 mm, greater than about 2250 nm, or even greater than about 2500 mm. Typical dimensions have a maximum patterned width of about 1400 mm. The large dimensions are possible by using a combination of roll-to-roll processing and a cylindrical master template. Films with these dimensions can be used to impart nanostructures over entire large digital displays (e.g., a 55 inch diagonal AMOLED HDTV, with dimensions of 52 inches wide by 31.4 inches tall).

The receptor substrate can optionally include a buffer layer on a side of the receptor substrate to which a light extraction color filter laminate is applied. Examples of buffer layers are disclosed in U.S. Pat. No. 6,396,079 (Hayashi et al.), which is incorporated herein by reference as if fully set forth. One type of buffer layer is a thin layer of $SiO_2$, as disclosed in K. Kondoh et al., *J. of Non-Crystalline Solids* 178 (1994) 189-98 and T-K. Kim et al., *Mat. Res. Soc. Symp. Proc.* Vol. 448 (1997) 419-23.

A particular advantage of the transfer process disclosed herein is the ability to impart structure to receptor surfaces with large surfaces, such as display mother glass or architectural glass. The dimensions of these receptor substrates exceed those of a semiconductor wafer master template. The large dimensions of the light extraction color filter laminates are possible by using a combination of roll-to-roll processing and a cylindrical master template. An additional advantage of the transfer process disclosed herein is the ability to impart structure to receptor surface that are not planar. The receptor substrate can be curved, bent twisted, or have concave or convex features, due to the flexible format of the transfer tape. Receptor substrates may include, for example, automotive glass, sheet glass, flexible electronic substrates such as circuitized flexible film, display backplanes, solar glass, metal, polymers, polymer composites, and fiberglass.

Transfer Layer and pOCL Materials

A transfer layer can be used to fill the nanostructured template, and is a material capable of substantially planarizing the adjacent layer (e.g., the template layer) while also conforming to (and possibly planarizing) the surface of the receptor layer (this layer maybe planar or structured). In some cases, the transfer layer can be more accurately described as being the nanostructured transfer layer, although structures other than those on a nanometer scale may be included. The materials used in the transfer layer can also be used as the pOCL materials that are photosensitive OCL precursors, as described elsewhere. As used herein, the optical coupling layer precursor (pOCL) can also be referred to as a photosensitive OCL, since in most cases, the optical coupling layer precursor generally can be cured to an optical coupling layer (OCL) through the use of, for example, visible or ultraviolet radiation curing. The transfer layer can alternatively be a bilayer of two different materials where the bilayer has a multi-layer structure or where one of the materials is at least partially embedded in the other material. The two materials for the bilayer can optionally have different indices of refraction. One of the bilayers can optionally comprise an adhesion promoting layer.

In some embodiments, structured or nano-structured layers are substantially planarized by another layer. Substantial planarization means that the amount of planarization (P %), as defined by Equation (1), is preferably greater than 50%, more preferably greater than 75%, and most preferably greater than 90%.

$$P\% = (1-(t_1/h_1))*100 \qquad \text{Equation (1)}$$

where $t_1$ is the relief height of a surface layer and $h_1$ is the feature height of features covered by the surface layer, as further disclosed in P. Chiniwalla, *IEEE Trans. Adv. Packaging* 24(1), 2001, 41.

Materials that may be used for the transfer layer include polysiloxane resins, polysilazanes, polyimides, silsesquioxanes of bridge or ladder-type, silicones, and silicone hybrid materials and many others. Exemplary polysiloxane resins include PERMANEW 6000 L510-1, available from California Hardcoat, Chula Vista, Calif. These molecules typically have an inorganic component which leads to high dimensional stability, mechanical strength, and chemical resistance, and an organic component that helps with solubility and reactivity. There are many commercial sources of these materials, which are summarized in Table 1 below. Other classes of materials that may be of use are benzocyclobutenes, soluble polyimides, and polysilazane resins, for example. Exemplary polysilazane resins include very low and low temperature cure inorganic polysilazanes such as NAX120 and NL 120A inorganic polysilazanes, available from AZ Electronic Materials, Branchburg, N.J.

The transfer layer can comprise any material as long as it has the desired rheological and physical properties discussed previously. Typically, the transfer layer is made from a polymerizable composition comprising monomers which are cured using actinic radiation, e.g., visible light, ultraviolet radiation, electron beam radiation, heat and combinations thereof. Any of a variety of polymerization techniques, such as anionic, cationic, free radical, condensation or others may be used, and these reactions may be catalyzed using photo, photochemical or thermal initiation. These initiation strategies may impose thickness restrictions on the transfer layer, i.e. the photo or thermal trigger must be able to uniformly react throughout the entire film volume. Useful polymerizable compositions comprise functional groups known in the art, such as epoxide, episulfide, vinyl, hydroxyl, allyloxy, (meth)acrylate, isocyanate, cyanoester, acetoxy, (meth)acrylamide, thiol, silanol, carboxylic acid, amino, vinyl ether, phenolic, aldehyde, alkyl halide, cinnamate, azide, aziridine, alkene, carbamates, imide, amide, alkyne, and any derivatives or combinations of these groups. The monomers used to prepare the transfer layer can comprise polymerizable oligomers or copolymers of any suitable molecular weight such as urethane (meth)acrylates, epoxy (meth)acrylates, polyester (meth)acrylates) and the like. The reactions generally lead to the formation of a three-dimensional macromolecular network and are known in the art as negative-tone photoresists, as reviewed by Shaw et al., "Negative photoresists for optical lithography," *IBM Journal of Research and Development* (1997) 41, 81-94. The formation of the network may occur through either through covalent, ionic, or hydrogen bonding or through physical crosslinking mechanisms such as chain entanglement. The reactions can also be initiated through one or more intermediate species, such as free-radical initiators, photosensitizers, photoacid generators, photobase generators, or thermal acid generators. Other molecular species may be involved in network formation as well, such as crosslinker molecules containing two or more functional groups known in the art to be reactive with the previously mentioned molecular species.

Reinforced silicone polymers can be used for the transfer layer, due to their high chemical stability and excellent adhesion to glasses such as float glass and borosilicate glass, and also some inorganic oxides such as, for example, molybdenum oxide which may be used as an OLED capping layer. Silicones are also well known not to adhere to other polymers, which makes this material straightforward to release from microstructured polymer tools, but difficult to transfer as one component in a dyad, unless the other component is also a silicone. One such silicone formulation, is known as SYLGARD 184 (Dow Corning, Midland, Mich.), which is a 2-component mixture of polydimethylsiloxane and vinylsiloxane mixed with hydrosiloxane and a platinum catalyst. Slight heating of this mixture causes the silicone network to form via platinum-catalyzed hydrosilylation curing reaction. Other silicones and catalysts can be used to the same effect. Gelest Inc. (Morrisville, Pa.) manufactures a wide variety of siloxanes functionalized with various reactive groups (epoxy, carbinol, mercapto, methacryloxy amino, silanol) for example. Gelest also sells these siloxanes pre-compounded with various additives, such as fully condensed silica nanoparticles or MQ resins, to tune the mechanical properties of the silicone network. Other platinum catalysts can also be used, such as (trimethyl) methyl cyclopentadenyl platinum (IV) (Strem Chemicals Inc., Newburyport, Mass.), which activates via ultraviolet radiation but still requires a subsequent thermal cure. Photocurable silicone systems are advantageous because as long as they are kept in the dark, their viscosity decreases with increasing temperature, allowing bubbles to escape and better penetration into nanostructured tools.

Different varieties of the above materials can be synthesized with higher refractive index by incorporating nanoparticles or metal oxide precursors in with the polymer resin. Silecs SC850 material is a modified silsesquioxane (n≈1.85) and Brewer Science high index polyimide OptiNDEX D1 material (n≈1.8) are examples in this category. Other materials include a copolymer of methyltrimethoxysilane (MTMS) and bistriethoxysilylethane (BTSE) (Ro et. al, *Adv. Mater.* 2007, 19, 705-710). This synthesis forms readily soluble polymers with very small, bridged cyclic cages of silsesquioxane. This flexible structure leads to increased packing density and mechanical strength of the coating. The ratio of these copolymers can be tuned for very low coefficient of thermal expansion, low porosity and high modulus.

In some embodiments, the transfer layer can include polyvinyl silsesquioxane polymers. These polymers can be prepared by the hydrolysis of vinyltriethoxysilane

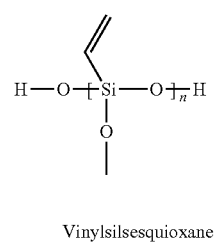

(I)

Vinylsilsesquioxane

Upon polymerization, typically by the addition of a photoinitiator followed by exposure to ultraviolet radiation, a three dimensional network is formed by free radical polymerization of the many vinyl groups.

The transfer layer material typically can meet several requirements. First, it can conform to the structured surface of the template layer on which it is coated. This means that the viscosity of the coating solution should be low enough to be able to flow into very small features without the entrapment of air bubbles, which will lead to good fidelity of the replicated structure. If it is solvent based, it should be coated from a solvent that does not dissolve or swell the underlying template layer, which would cause cracking, swelling, or other detrimental defects of the transfer layer. It is desirable that the solvent has a boiling point below that of the template layer glass transition temperature. Preferably, isopropanol, butyl alcohol and other alcoholic solvents have been used. Second, the material should cure with sufficient mechanical integrity (e.g., "green strength"). If the transfer layer material does not have enough green strength after curing, the transfer layer pattern features can slump and the replication fidelity can degrade. Third, for some embodiments, the refractive index of the cured material should be tailored to produce the proper optical effect. Fourth, the transfer layer material should be thermally stable (e.g., showing minimal cracking, blistering, or popping) above the temperature of the upper range of the future process steps of the substrate. Typically the materials used for this layer undergo a condensation curing step, which causes shrinkage and the build-up of compressive stresses within the coating. There are a few materials strategies which are used to minimize the formation of these residual stresses which have been put to use in several commercial coatings which satisfy all of the above criteria.

It can be advantageous to adjust the refractive index of both the transfer layer and OCL layers. For example, in OLED light extraction applications, the nanostructure imparted by the light extraction color filter laminate is located at a structured surface of the transfer layer. The transfer layer has a first side at the structured interface and a second side coincident with an adjacent layer, the OCL. In this application, the refractive index of the transfer layer can be index-matched to the OCL layer. The phrase "index-matched" refers to the matching of the refractive indices of two adjacent materials, layers and/or coatings.

Nanoparticles can be used to adjust refractive index of the transfer and OCL layers. For example, in acrylic coatings, silica nanoparticles (n≈1.42) can be used to decrease refractive index, while zirconia nanoparticles (n≈2.1) can be used to increase the refractive index. If the index difference is large between the nanoparticles and binder, a haze will develop inside the bulk of the coating. For applications in which haze is a desirable attribute (e.g., uniform light distribution in OLED solid state lighting elements) the index-matching criteria can be generally relaxed. Control over the relative index of the nanoparticles and binder provide control over the resulting optical properties. There is also a limit to the concentration of nanoparticles in the resin before particle aggregation begins to occur, thereby limiting the extent to which refractive index of the coating can be tuned.

170 and pixel defining layer 160, and a thin film encapsulation layer 190 is deposited to protect the moisture and oxygen sensitive device from the environment and also from any subsequent processing steps.

Light extraction color filter laminate 105 includes the support 110 having color filter array 127 disposed on a surface thereof. The color filter array 127 includes red filters 127r, green filters 127g, blue filters 127b, and black matrix 127bk separating adjacent color filters, as known to one of skill in the art. Each of the red, green, and blue filters (127r, 127g, 127b) are disposed such that in the finished device, they in registration with individual OLED pixels. A nanostructured color filter planarization layer 124 that includes a nanostructured surface 121 opposite the support 110 is disposed over the color filter array 127. A high refractive index backfill layer 126 (also referred to as a high index

TABLE 1

Thermally Stable Transfer Materials of Low and High Refractive Index

| Material Name or Trade Designation | Type | Available from |
|---|---|---|
| TecheGlas GRx resins | T-resin (methyl silsesquioxane) | TechneGlas (Perrysburg, Ohio) |
| HSG-510 | T-resin (methyl silsesquioxane) | Hitachi Chemical (Tokyo, Japan) |
| ACCUGLASS 211 | T-Q resin (methyl silsesquioxane) | Honeywell (Tempe, AZ) |
| HARDSIL AM | silica nanocomposite | Gelest Inc (Morrisville, PA) |
| MTMS-BTSE Copolymer (Ro et. al, Adv. Mater. 2007, 19, 705-710) | bridged silsesquioxane | National Institute of Standards and Technology (Gaithersburg, MD) |
| PERMANEW 6000 | silica-filled methyl-polysiloxane polymer containing a latent heat-cure catalyst system | California Hardcoat (Chula Vista, CA) |
| FOX Flowable OXide | hydrogen silsesquioxane | Dow Corning (Midland, MI) |
| ORMOCER, ORMOCLAD, ORMOCORE | silicone hybrid | Micro Resist GmBH (Berlin, Germany) |
| SILECS SCx resins | silicone hybrid (n = 1.85) | Silecs Oy (Espoo, Finland) |
| OPTINDEX D1 | soluble polyimide (n = 1.8) | Brewer Science (Rolla, MO) |
| CORIN XLS resins | soluble polyimide | NeXolve Corp. (Huntsville, AL) |
| CERASET resins | polysilazanes | KiON Specialty Polymers (Charlotte, NC) |
| BOLTON metals | low melting metal | Bolton Metal Products (Bellafonte, PA) |
| SYLGARD 184 | silicone network polymer | Dow Corning (Midland, MI) |

Figure 1D:
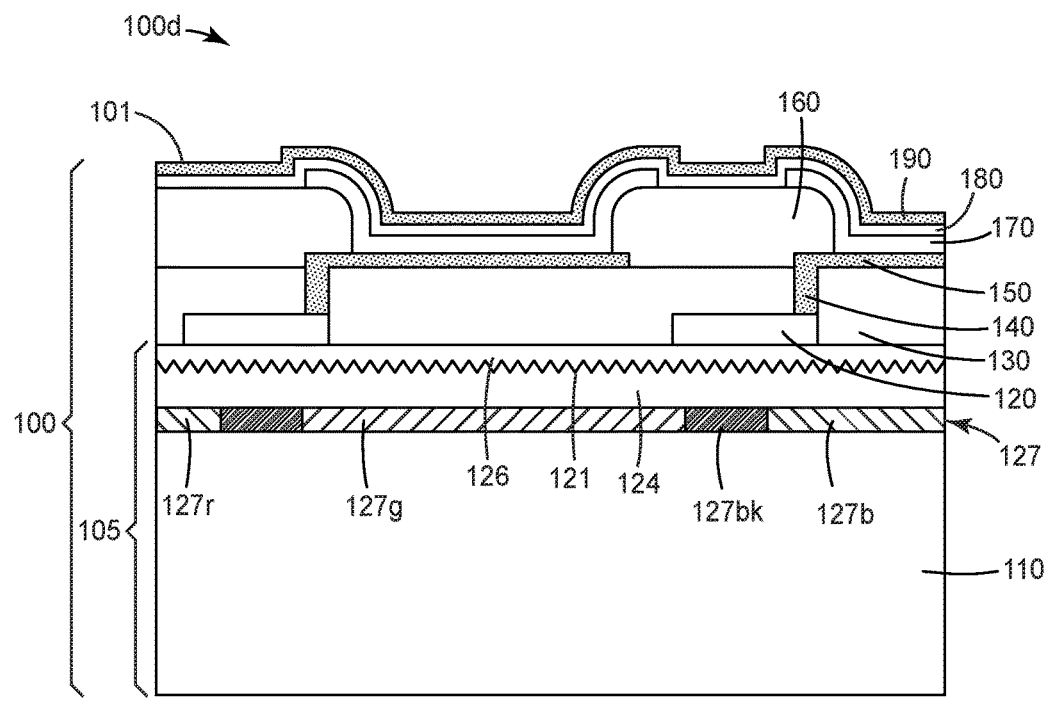
FIG. 1D shows a schematic cross-section view of portion of a nanostructured BE CBW AMOLED device.

FIG. 1D shows a schematic cross-section view of portion of a nanostructured BE CBW AMOLED device 100d, according to one aspect of the disclosure. The nanostructured BE CBW AMOLED device 100d includes a BE AMOLED 100 constructed on a light extraction color filter laminate 105 having a support 110. Pixel circuitry 120 is disposed on the light extraction color filter laminate 105 opposite the support 110, and a pixel circuit planarization layer 130 initially deposited covering the entire light extraction color filter laminate 105, as known to those of skill in the art. BE AMOLED 100 further includes at least one via 140 passing through the pixel circuit planarization layer 130 providing an electrical connection to at least one bottom electrode 150 deposited over a portion of the pixel circuit planarization layer 130. A pixel defining layer 160 is deposited over the pixel circuit planarization layer 130 and a portion of each bottom electrode 150 to define and electrically isolate individual pixels. An OLED 170 having a plurality of known layers (not shown) that is capable of emitting white color spectrum of light, is deposited over the bottom electrode 150 and a portion of the pixel defining layer 160, a top electrode 180 is deposited over the OLED nanostructured transfer layer 126) is deposited onto the nanostructured surface 121 forming a planar surface of the light extraction color filter laminate 105 onto which the BE AMOLED 100 can be built, as described elsewhere.

The nanostructured BE CBW AMOLED device 100d can be made by the techniques described in co-pending U.S. Patent Publication No. 2016/0268553, the entire disclosure of which is hereby included by reference. Generally, the technique includes a step of providing a light extraction color filter laminate 105 having a support 110, a color filter array 127, and an exterior transfer layer 126 having an embedded nanostructure; and forming a bottom emitting OLED array on the exterior transfer layer 126, in registration with the color filter array 127.

Figure 1E:
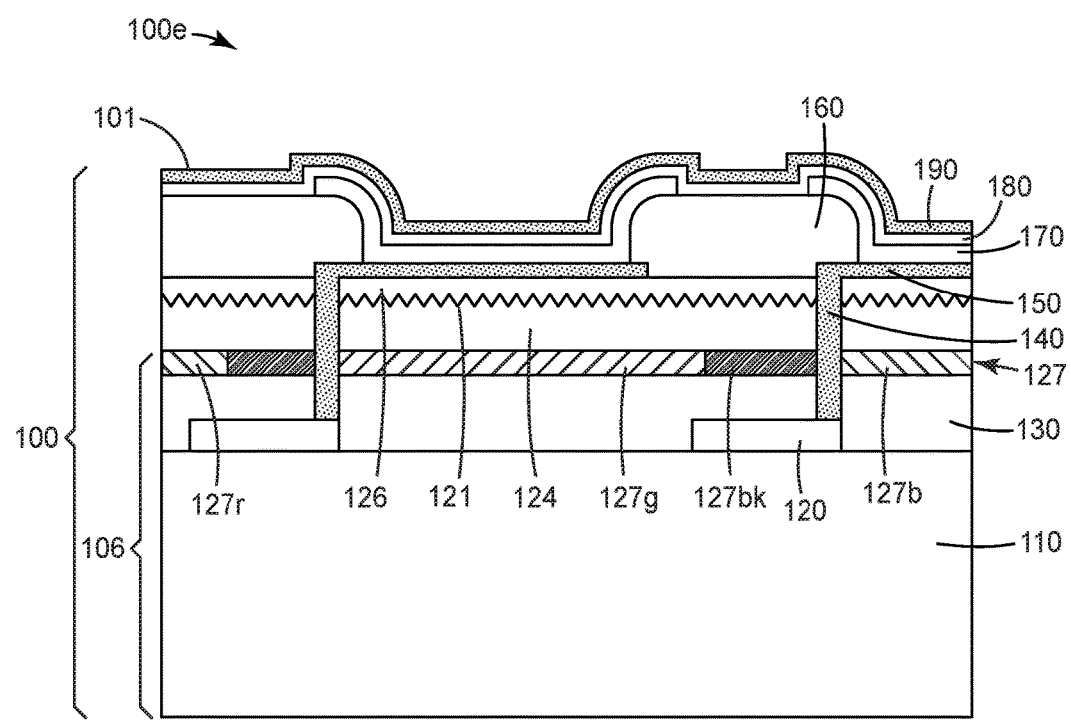
FIG. 1E shows a schematic cross-section view of portion of a nanostructured BE CBW AMOLED device.

FIG. 1E shows a schematic cross-section view of portion of a nanostructured BE CBW AMOLED device 100e, according to one aspect of the disclosure. The nanostructured BE CBW AMOLED device 100e includes a BE AMOLED 100 constructed on a light extraction color filter laminate 106 having a support 110. Light extraction color filter laminate 106 includes the support 110 having pixel circuitry 120 disposed on a surface thereof, and a pixel circuit planarization layer 130 covering the entire support 110. A color filter array 127 is disposed on the pixel circuit planarization layer 130. The color filter array 127 includes red filters 127r, green filters 127g, blue filters 127b, and black matrix 127bk separating adjacent color filters, as known to one of skill in the art. Each of the red, green, and blue filters (127r, 127g, 127b) are disposed such that in the finished device, they in registration with individual OLED pixels. A nanostructured color filter planarization layer 124 that includes a nanostructured surface 121 opposite the support 110 is disposed over the color filter array 127. A high refractive index backfill layer 126 (also referred to as a high index nanostructured transfer layer 126) is deposited onto the nanostructured surface 121 forming a planar surface of the light extraction color filter laminate 106 onto which the BE AMOLED 100 is disposed.

BE AMOLED 100 includes at least one via 140 passing through the high index nanostructured transfer layer 126, nanostructured color filter planarization layer 124, the color filter array 127, and the pixel circuit planarization layer 130, providing an electrical connection to at least one bottom electrode 150 deposited over a portion of the high index nanostructured transfer layer 126. A pixel defining layer 160 is deposited over the high index nanostructured transfer layer 126 and a portion of each bottom electrode 150, to define and electrically isolate individual pixels. An OLED 170 having a plurality of known layers (not shown) that is capable of emitting white color spectrum of light, is deposited over the bottom electrode 150 and a portion of the pixel defining layer 160, a top electrode 180 is deposited over the OLED 170 and pixel defining layer 160, and a thin film encapsulation layer 190 is deposited to protect the moisture and oxygen sensitive device from the environment and also from any subsequent processing steps.

The nanostructured BE CBW AMOLED device 100d can be made by the techniques described in co-pending U.S. Patent Publication No. 2016/0268553, the entire disclosure of which is hereby included by reference. Generally, the technique includes a step of providing a support 110 having pixel circuitry 120 disposed on a surface thereof, and a pixel circuit planarization layer 130 initially deposited covering the entire support 110. A color filter array 127 is disposed on the pixel circuit planarization layer 130. A nanostructured color filter planarization layer 124 that includes a nanostructured surface 121 opposite the support 110 is disposed over the color filter array 127. A high refractive index backfill layer 126 (also referred to as a high index nanostructured transfer layer 126) is deposited onto the nanostructured surface 121 forming a planar surface of the light extraction color filter laminate 106 onto which the BE AMOLED 100 can be built.

At least one via 140 is formed, passing through the high index nanostructured transfer layer 126, nanostructured color filter planarization layer 124, the color filter array 127, and the pixel circuit planarization layer 130, providing an electrical connection to at least one bottom electrode 150 deposited over a portion of the high index nanostructured transfer layer 126. A pixel defining layer 160 is deposited over the high index nanostructured transfer layer 126 and a portion of each bottom electrode 150, to define and electrically isolate individual pixels. An OLED 170 having a plurality of known layers (not shown) that is capable of emitting white color spectrum of light, is deposited over the bottom electrode 150 and a portion of the pixel defining layer 160, a top electrode 180 is deposited over the OLED 170 and pixel defining layer 160, and a thin film encapsulation layer 190 is deposited to protect the moisture and oxygen sensitive device from the environment and also from any subsequent processing steps.

Figure 1F:
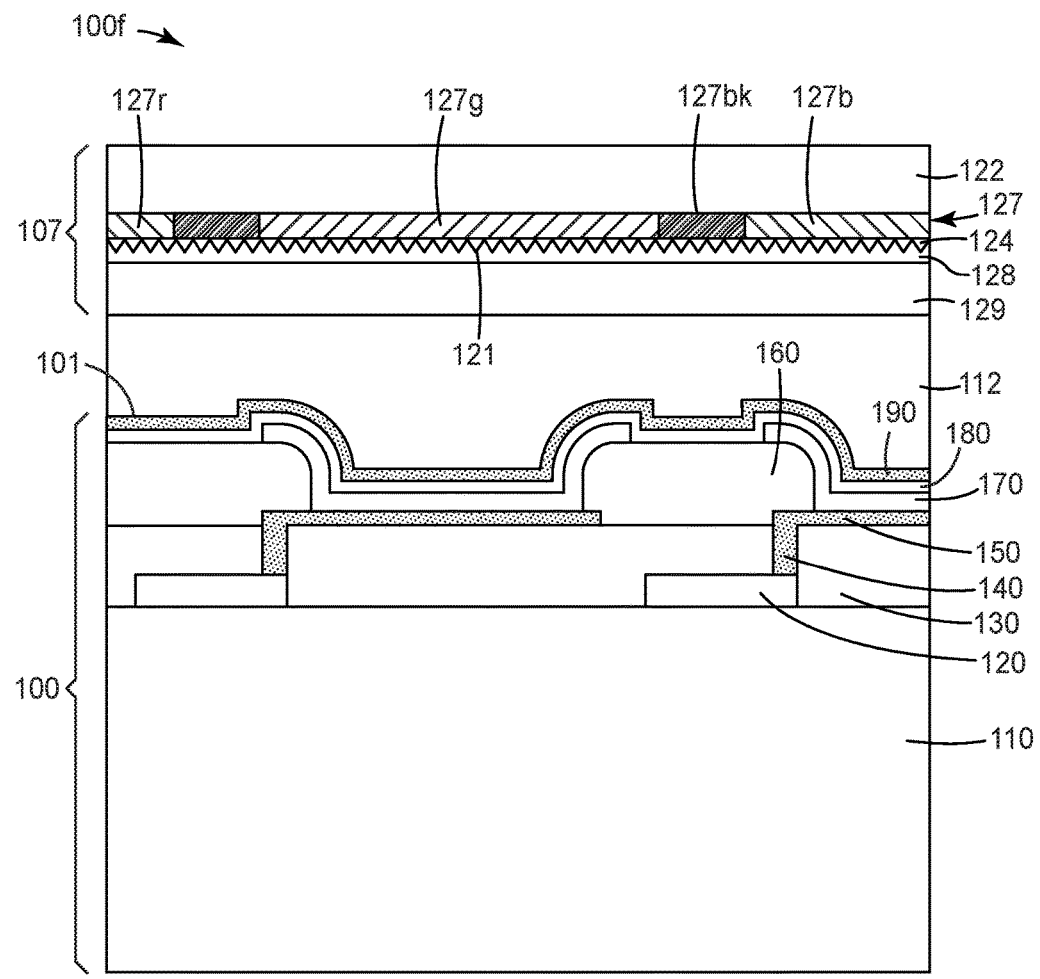
FIG. 1F shows a schematic cross-section view of portion of a nanostructured TE CBW AMOLED device.

FIG. 1F shows a schematic cross-section view of portion of a nanostructured TE CBW AMOLED device 100f, according to one aspect of the disclosure. The nanostructured TE CBW AMOLED device 100f includes a TE AMOLED 100 having an OLED support 110, pixel circuitry 120 disposed on the OLED support 110, and a pixel circuit planarization layer 130 initially deposited covering the entire OLED support 110 and pixel circuitry 120, as known to those of skill in the art. TE AMOLED 100 further includes at least one via 140 passing through the pixel circuit planarization layer 130 providing an electrical connection to at least one bottom electrode 150 deposited over a portion of the pixel circuit planarization layer 130. A pixel defining layer 160 is deposited over the pixel circuit planarization layer 130 and a portion of each bottom electrode 150 to define and electrically isolate individual pixels. An OLED 170 having a plurality of known layers (not shown) that is capable of emitting white color spectrum of light, is deposited over the bottom electrode 150 and a portion of the pixel defining layer 160, a transparent top electrode 180 is deposited over the OLED 170 and pixel defining layer 160, and a thin film encapsulation layer 190 is deposited to protect the moisture and oxygen sensitive device from the environment and also from any subsequent processing steps.

The nanostructured TE CBW AMOLED device 100f further includes a high index polymeric optical coupling layer (OCL) 112 disposed on a top surface 101 of the TE AMOLED 100 (i.e., on top of the thin film encapsulation layer 190), and includes a planar surface opposite the TE AMOLED 100. A light extraction color filter laminate 107 including a substrate 122 is laminated and affixed to the high index OCL 112 such that the substrate 122 and the OLED support 110 define the exterior surfaces of the TE CBW AMOLED device 100f, and encapsulate the moisture and oxygen sensitive device elements from the environment. In some cases, the high index OCL 112 can instead be included as the top surface of the light extraction color filter laminate 102 that can then be laminated and affixed to the thin film encapsulation layer 190, as described elsewhere.

Light extraction color filter laminate 107 includes the substrate 122 having color filter array 127 disposed on a surface thereof. The color filter array 127 includes red filters 127r, green filters 127g, blue filters 127b, and black matrix 127bk separating adjacent color filters, as known to one of skill in the art. Each of the red, green, and blue filters (127r, 127g, 127b) are disposed in registration with individual OLED pixels. A color filter planarization layer 128 includes a nanostructured surface 121 opposite the substrate 122. The nanostructured surface 121 is preferably in physical contact with the color filter array 127, and nanostructured surface 121 can optionally be open faced features. A color filter planarization layer 128 has a planar surface, opposite nanostructured surface 121, that can be laminated to the high index OCL 112 adjacent the top surface 101 of the TE AMOLED 100, as described elsewhere. An optional auxiliary layer 129 can be disposed between the color filter planarization layer 128 and the high index OCL 112; in some cases the optional auxiliary layer 129 can include, for example, a transparent conducting oxide (TCO) such as indium tin oxide (ITO). The optional auxiliary layer 129 can be disposed on the top surface of either the light extraction color filter laminate 107 or the high index OCL 112 prior to lamination of the two films.

In some cases, the index of refraction of the color filter planarization layer 128 can be greater than or equal to the index of refraction of the high index OCL 112 for efficient extraction of light from the TE CBW AMOLED device 100*f*. In one particular embodiment, both the color filter planarization layer 128 and the high index OCL 112 can comprise the same material.

The nanostructured TE CBW AMOLED device 100*f* can be made by the techniques described in co-pending U.S. Patent Publication No. 2016/0268553, the entire disclosure of which is hereby included by reference. Generally, the technique includes a step of coating an OCL precursor on a top surface 101 of the TE AMOLED 100 array, thereby forming a planarized OCL precursor surface. Then, a light extraction color filter laminate 107 is laminated onto the OCL precursor surface such that a planar outer surface of the light extraction color filter laminate 107 contacts the OCL precursor surface, wherein the light extraction color filter laminate 107 includes an embedded nanostructured surface 121. Then, the OCL precursor is polymerized to form the high index OCL 112 and bond the planar outer surface of the light extraction color filter laminate 107 to the high index OCL 112. The light extraction color filter laminate 107 and the OCL precursor can both include a polymerizable composition comprising monomers which are cured using actinic radiation, e.g., visible light, ultraviolet radiation, electron beam radiation, heat and combinations thereof.

Figure 1G:
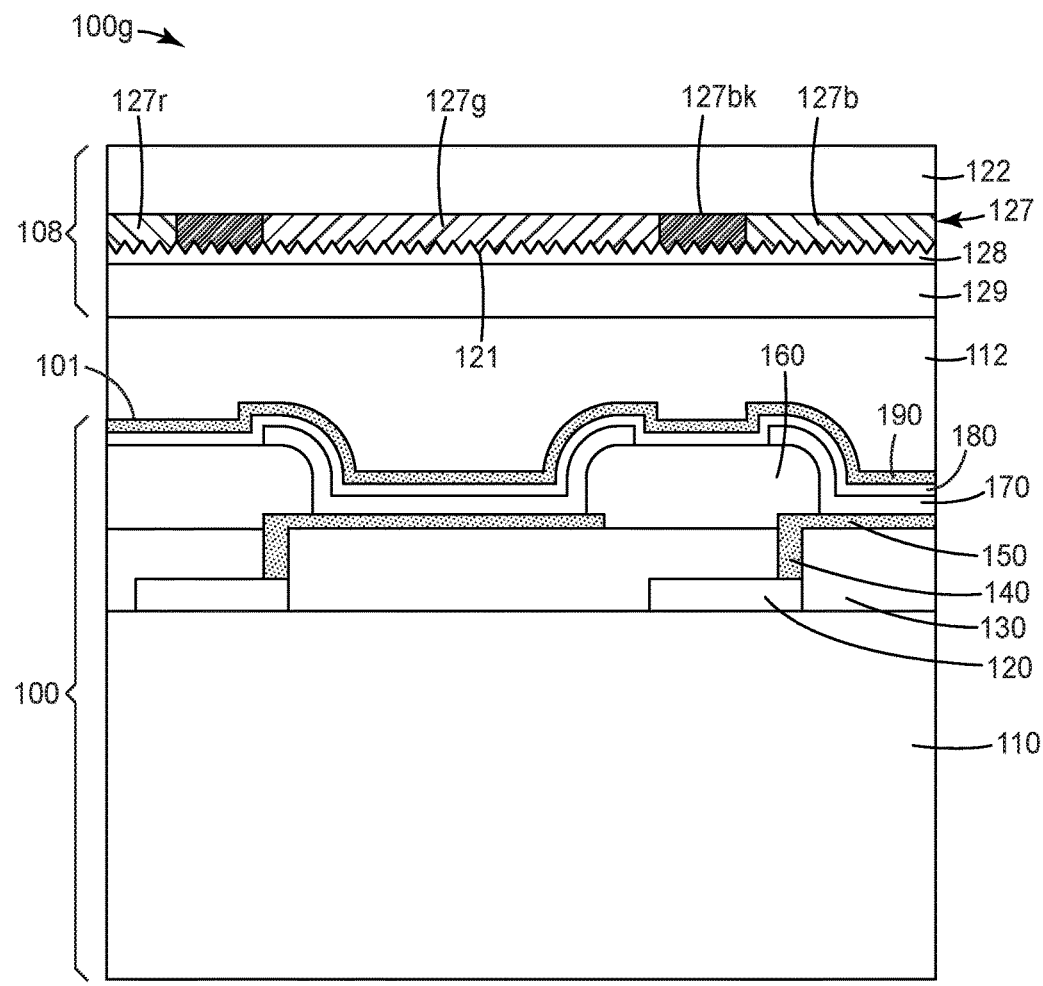
FIG. 1G shows a schematic cross-section view of portion of a nanostructured TE CBW AMOLED device.

FIG. 1G shows a schematic cross-section view of portion of a nanostructured TE CBW AMOLED device 100*g*, according to one aspect of the disclosure. The nanostructured TE CBW AMOLED device 100*g* includes a TE AMOLED 100 having an OLED support 110, pixel circuitry 120 disposed on the OLED support 110, and a pixel circuit planarization layer 130 initially deposited covering the entire OLED support 110 and pixel circuitry 120, as known to those of skill in the art. TE AMOLED 100 further includes at least one via 140 passing through the pixel circuit planarization layer 130 providing an electrical connection to at least one bottom electrode 150 deposited over a portion of the pixel circuit planarization layer 130. A pixel defining layer 160 is deposited over the pixel circuit planarization layer 130 and a portion of each bottom electrode 150 to define and electrically isolate individual pixels. An OLED 170 having a plurality of known layers (not shown) that is capable of emitting white color spectrum of light, is deposited over the bottom electrode 150 and a portion of the pixel defining layer 160, a transparent top electrode 180 is deposited over the OLED 170 and pixel defining layer 160, and an optional thin film encapsulation layer 190 is deposited to protect the moisture and oxygen sensitive device from the environment and also from any subsequent processing steps.

The nanostructured TE CBW AMOLED device 100*g* further includes a high index polymeric optical coupling layer (OCL) 112 disposed on a top surface 101 of the TE AMOLED 100 (i.e., on top of the thin film encapsulation layer 190), and includes a planar surface opposite the TE AMOLED 100. A light extraction color filter laminate 108 including a substrate 122 is laminated and affixed to the high index OCL 112 such that the substrate 122 and the OLED support 110 define the exterior surfaces of the TE CBW AMOLED device 100*g*, and encapsulate the moisture and oxygen sensitive device elements from the environment. In some cases, the high index OCL 112 can instead be included as the top surface of the light extraction color filter laminate 102 that can then be laminated and affixed to the thin film encapsulation layer 190, as described elsewhere.

Light extraction color filter laminate 108 includes the substrate 122 having color filter array 127 disposed on a surface thereof. The color filter array 127 includes red filters 127*r*, green filters 127*g*, blue filters 127*b*, and black matrix 127*bk* separating adjacent color filters, as known to one of skill in the art. Each of the red, green, and blue filters (127*r*, 127*g*, 127*b*) are disposed in registration with individual OLED subpixels. The color filter array 127 includes a nanostructured surface 121 opposite substrate 122, and nanostructured surface 121 can optionally be open faced features. A color filter planarization layer 128 provides has a planar top surface, opposite nanostructured surface 121 that can be laminated to the high index OCL 112 adjacent the top surface 101 of the TE AMOLED 100, as described elsewhere. An optional auxiliary layer 129 can be disposed between the color filter planarization layer 128 and the high index OCL 112; in some cases the optional auxiliary layer 129 can include, for example, a transparent conducting oxide (TCO) such as indium tin oxide (ITO). The optional auxiliary layer 129 can be disposed on the top surface of either the light extraction color filter laminate 108 or the high index OCL 112 prior to lamination of the two films.

In some cases, the index of refraction of the color filter planarization layer 128 can be greater than or preferably equal to the index of refraction of the high index OCL 112 for efficient extraction of light from the TE CBW AMOLED device 100*g*. In one particular embodiment, both the color filter planarization layer 128 and the high index OCL 112 can comprise the same material.

The nanostructured TE CBW AMOLED device 100*g* can be made by the techniques described in co-pending U.S. Patent Publication No. US2016/0268553, the entire disclosure of which is hereby included by reference. Generally, the technique includes a step of coating an OCL precursor on a top surface 101 of the TE AMOLED 100 array, thereby forming a planarized OCL precursor surface. Then, a light extraction color filter laminate 108 is laminated onto the OCL precursor surface such that a planar outer surface of the light extraction color filter laminate 108 contacts the OCL precursor surface, wherein the light extraction color filter laminate 108 includes an embedded nanostructured surface 121. Then, the OCL precursor is polymerized to form the high index OCL 112 and bond the planar outer surface of the light extraction color filter laminate 108 to the high index OCL 112. The light extraction color filter laminate 108 and the OCL precursor can both include a polymerizable composition comprising monomers which are cured using actinic radiation, e.g., visible light, ultraviolet radiation, electron beam radiation, heat and combinations thereof.

For the top emitting OLED embodiments in FIGS. 1A, 1B, 1C, 1F, and 1G, the light extraction color filter laminates can alternatively be within a separate article to be applied to the OLED devices. Such constructions can include an OLED substrate, a color filter substrate, and an OCL between and in contact with the OLED substrate and the color filter substrate.

This alternative construction for FIG. 1A includes an OLED substrate 100 with a top surface 101 and capable of emitting a white color spectrum of light through the top surface, a light extraction color filter substrate 102, and an OCL 112. The color filter substrate includes a support substrate 122, a nanostructured transfer layer 124 index-matched to the support substrate having a planar surface in contact with the support substrate and a nanostructured opposing surface 121, a high refractive index transfer layer planarization layer 126 conforming to and planarizing the nanostructured surface of the transfer layer and having a planar opposing surface, a high refractive index color filter layer 127 in contact with the planar surface of the high refractive index transfer layer planarization layer 126, and a high refractive index color filter planarization layer 128 in contact with the high refractive index color filter layer. The OCL 112 is in contact with the OLED top surface 101 and has a planar opposing surface that may be in contact with the high refractive index color filter planarization layer 128. The nanostructured surface of the transfer layer forms an interface between high index materials and low index materials. Also shown is an optional auxiliary layer 129 which can be disposed between the high refractive index color filter planarization layer 128 and the OCL 112.

This alternative construction for FIG. 1B includes an OLED substrate 100 with a top surface 101 and capable of emitting a white color spectrum of light through the top surface, a light extraction color filter laminate 103, and an OCL 112. The color filter substrate includes a support substrate 122 having a planar surface, a color filter layer 127 in contact with the planar surface of the support substrate, a nanostructured transfer layer 124, and a high refractive index transfer layer planarization layer 126 conforming to and planarizing the nanostructured surface of the transfer layer 124 and having a planar opposing surface. The OCL 112 is in contact with the OLED top surface 101 and has a planar opposing surface that may be in contact with the transfer layer planarization layer 126. Optionally, the embodiment may further include a color filter planarization layer 128 in contact with the color filter layer 127, wherein the nanostructured transfer layer 124 is index-matched to the color filter planarization layer 128. The nanostructured transfer layer 124 having a planar surface, in contact with the color filter planarization layer 128, and a nanostructured opposing surface. The nanostructured surface of the transfer layer forms an interface between high index materials and low index materials. Also shown is an optional auxiliary layer 129 which can be disposed between the high refractive index transfer layer planarization layer 126 and the OCL 112.

This alternative construction for FIG. 1F of a color-by-white (CBW) image display 100*f* includes an OLED substrate 100 with a top surface 101 and capable of emitting a white color spectrum of light through the top surface, a color filter substrate 107, and an OCL 112. The color filter substrate includes a support substrate 122 having a planar surface, a color filter layer 127 in contact with the planar surface of the support substrate, a nanostructured transfer layer 124 index-matched to the color filter layer having a planar surface in contact with the color filter layer and a nanostructured opposing surface, and high refractive index color filter planarization layer 128 in contact with the transfer layer conforming to and planarizing the nanostructured surface of the transfer layer and having a planar opposing surface. The OCL is in contact with the OLED top surface and has a planar opposing surface in contact with the transfer layer planarization layer. The nanostructured surface of the transfer layer forms an interface between high index materials and low index materials. In another embodiment, high refractive index color filter planarization layer 128 may be replaced by a high refractive index transfer layer planarization layer 126 (not shown in FIG. 1F). Also shown is an optional auxiliary layer 129 which can be disposed between the high refractive index color filter planarization layer 128 and the OCL 112. If high refractive index color filter planarization layer 128 may be replaced by a high refractive index transfer layer planarization layer 126, optional auxiliary layer 129 can be disposed between the high refractive index transfer layer planarization layer 126 and the OCL 112.

This alternative construction for FIG. 1G of a color-by-white (CBW) image display 100*g* includes an OLED substrate 100 with a top surface 101 and capable of emitting a white color spectrum of light through the top surface, a color filter substrate 108, and an OCL 112. The color filter substrate includes a support substrate 122 having a planar surface, a color filter layer 127 having a planar surface in contact with the planar surface of the support substrate having a planar surface, and a nanostructured opposing surface 121, and a high refractive index color filter layer planarization layer 128 in contact with the color filter layer conforming to and planarizing the nanostructured surface of the color filter layer and having a planar opposing surface. The OCL is in contact with the OLED top surface 101 and has a planar opposing surface that may be in contact with a high refractive index color filter layer planarization layer 128. The nanostructured surface of the transfer layer forms an interface between high index materials and low index materials. In another embodiment, high refractive index color filter planarization layer 128 may be replaced by a high refractive index transfer layer planarization layer 126 (not shown in FIG. 1G). Also shown is an optional auxiliary layer 129 which can be disposed between the high refractive index transfer layer planarization layer 128 and the OCL 112. If high refractive index color filter planarization layer 128 is replaced by a high refractive index transfer layer planarization layer 126, optional auxiliary layer 129 can be disposed between the high refractive index transfer layer planarization layer 126 and the OCL 112.

This alternative construction for FIG. 1C includes an OLED substrate 100 with a top surface 101 and capable of emitting a white color spectrum of light through the top surface, a light extraction color filter laminate 104, and an OCL 112. The color filter substrate includes a support substrate 122 having a planar surface, a color filter layer 127 in contact with the planar surface of the support substrate 122, and a nanostructured transfer layer 124. The OCL 112 is in contact with the OLED top surface 101 and has an opposing textured surface conforming to the nanostructured surface of the transfer layer 124. Optionally, the embodiment may further include a color filter planarization layer 128, disposed between the color filter layer 127 and the nanostructured transfer layer 124, wherein the nanostructured transfer layer 124 is index-matched to the color filter planarization layer 128. In this embodiment, the nanostructured transfer layer 124 has a planar surface, in contact with the color filter planarization layer 128, and a nanostructured opposing surface; and the color filter planarization layer 128 is also in contact with the color filter layer 127. The nanostructured surface of the transfer layer forms an interface between high index materials and low index materials. Also shown is an optional auxiliary layer 129 which can be disposed between the color filter planarization layer 128 and the nanostructured transfer layer 124.

For the top emitting OLED embodiments in FIGS. 1A, 1B, 1C, 1F, and 1G, the light extraction color filter laminates can alternatively be within a separate article to be applied to the OLED devices. Such constructions can include an OLED substrate, a color filter substrate, and an OCL between and in contact with the OLED substrate and the color filter substrate.

Figure 1H:
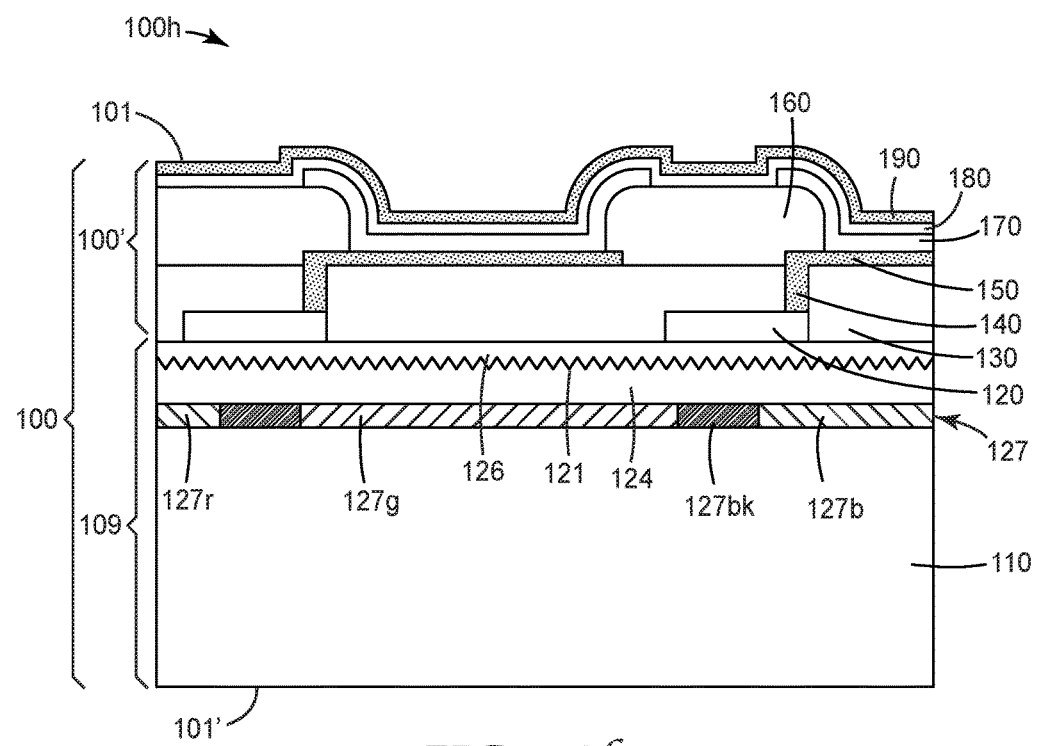
FIG. 1H shows a schematic cross-section view of portion of a nanostructured BE CBW AMOLED device.
Figure 1I:
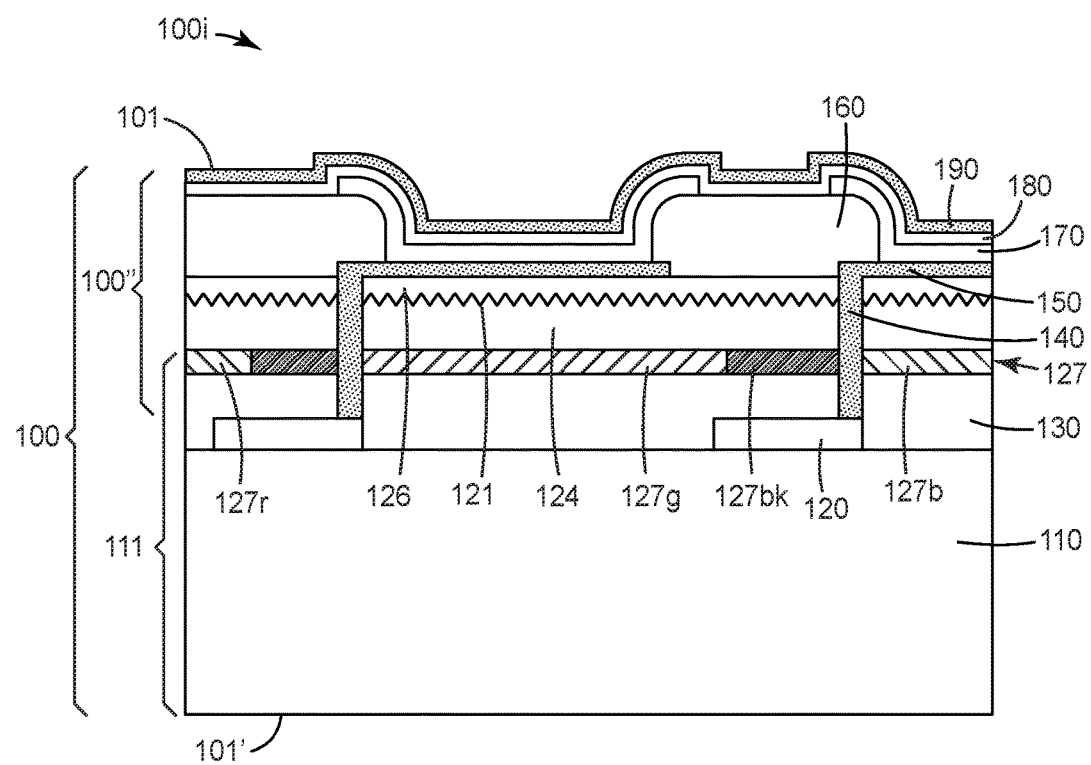
FIG. 1I shows a schematic cross-section view of portion of a nanostructured BE CBW AMOLED device.

For the bottom emitting OLED embodiment in FIGS. 1H and 1I, color filter laminates can alternatively be within a separate article to be utilized as a support in the fabrication of OLED devices and may include at least one or more components of the previously discussed OLED substrate, e.g. the OLED support.

The alternative construction of FIG. 1H of a color-by-white (CBW) image display 100h includes an OLED substrate 100 with a top surface 101 and bottom surface 101' capable of emitting a white color spectrum of light through the bottom surface 101'. The OLED substrate 100 includes OLED sub-structure 100' and color filter substrate 109. Color filter substrate 109 includes OLED support 110 having a planar surface, a color filter layer 127 in contact with the planar surface of the OLED support 110, a nanostructured transfer layer 124 index-matched to the color filter planarization layer having a planar surface in contact with the color filter layer and a nanostructured opposing surface 121, and a high refractive index transfer layer planarization layer 126 conforming to and planarizing the nanostructured surface 121 of the transfer layer 124 and having a planar opposing surface. OLED sub-structure 100' includes pixel circuitry 120 disposed on the planar surface of high refractive index transfer layer planarization layer 126 and a pixel circuit planarization layer 130 initially deposited covering at least a portion of the planar surface of high refractive index transfer layer planarization layer 126 and pixel circuitry 120, as known to those of skill in the art. OLED sub-structure 100' further includes at least one via 140 passing through the pixel circuit planarization layer 130 providing an electrical connection to at least one bottom electrode 150 deposited over a portion of the pixel circuit planarization layer 130. A pixel defining layer 160 is deposited over the pixel circuit planarization layer 130 and a portion of each bottom electrode 150 to define and electrically isolate individual pixels. An OLED 170 having a plurality of known layers (not shown) that is capable of emitting white color spectrum of light, is deposited over the bottom electrode 150 and a portion of the pixel defining layer 160, a transparent top electrode 180 is deposited over the OLED 170 and pixel defining layer 160, and an optional thin film encapsulation layer 190 is deposited to protect the moisture and oxygen sensitive device from the environment and also from any subsequent processing steps. Layer 190 can be made by the techniques described in, for example, U.S. Pat. No. 7,510,913.

The alternative construction of FIG. 1I of a color-by-white (CBW) image display 100i includes an OLED substrate 100 with a top surface 101 and bottom surface 101' capable of emitting a white color spectrum of light through the bottom surface 101'. The OLED substrate 100 includes OLED sub-structure 100'' and color filter substrate 111. Color filter substrate 111 includes OLED support 110 having a planar surface, pixel circuitry 120 disposed on OLED support 110, pixel circuit planarization layer 130 having a planar surface and initially deposited covering at least a portion of the planar surface OLED support 110 and pixel circuitry 120, a color filter layer 127 in contact with the planar surface of the pixel circuit planarization layer 130, a nanostructured transfer layer 124 index-matched to the color filter planarization layer having a planar surface in contact with the color filter layer and a nanostructured opposing surface 121, and a high refractive index transfer layer planarization layer 126 conforming to and planarizing the nanostructured surface 121 of the transfer layer 124 and having a planar opposing surface. Color filter substrate 111 may then be used as a base substrate for the fabrication of OLED substrate 100. OLED substrate 100 would further include OLED sub-structure 100'' which further includes at least one via 140 passing through the high refractive index transfer layer planarization layer 126, nanostructured transfer layer 124, color filter layer 127 and pixel circuit planarization layer 130, at least one bottom electrode deposited over a portion of high refractive index transfer layer planarization layer 126. The at least one via provides an electrical connection to the at least one bottom electrode 150 deposited over a portion of high refractive index transfer layer planarization layer 126. A pixel defining layer 160 is deposited over the pixel circuit planarization layer 130 and a portion of each bottom electrode 150 to define and electrically isolate individual pixels. An OLED 170 having a plurality of known layers (not shown) that is capable of emitting white color spectrum of light, is deposited over the bottom electrode 150 and a portion of the pixel defining layer 160, a transparent top electrode 180 is deposited over the OLED 170 and pixel defining layer 160, and an optional thin film encapsulation layer 190 is deposited to protect the moisture and oxygen sensitive device from the environment and also from any subsequent processing steps. Layer 190 can be made by the techniques described in, for example, U.S. Pat. No. 7,510,913. In FIG. 1I, OLED sub-structure 100'' includes the portion of bottom electrode 150 that fills via 140.

Referring to FIG. 1A, in another embodiment, the present disclosure relates to a light extraction color filter laminate 102, including a support substrate 122, a nanostructured transfer layer 124, index-matched to the support substrate 122, having a planar surface in contact with the support substrate 122 and a nanostructured opposing surface 121; a high refractive index transfer layer planarization layer 126 conforming to and planarizing the nanostructured surface 121 of the transfer layer 124 and having a planar opposing surface; and a high refractive index color filter layer 127, in contact with the planar surface of the high refractive index transfer layer planarization layer; and a high refractive index color filter planarization layer 128 in contact with the high refractive index color filter layer 127. The light extraction color filter laminate 102 may further include an optional auxiliary layer 129 adjacent to the high refractive index color filter planarization layer 128. The auxiliary layer 129 may comprise a transparent conductive oxide.

Referring to FIG. 1B, in another embodiment, the present disclosure relates to a light extraction color filter laminate 103, including a support substrate 122 having a planar surface, a color filter layer 127 in contact with the planar surface of the support substrate 122, a nanostructured transfer layer 124, having a planar surface and a nanostructured opposing surface 121; and a high refractive index transfer layer planarization layer 126 conforming to and planarizing the nanostructured surface 121 of the transfer layer 124 and having a planar opposing surface. The light extraction color filter laminate 103, may further include an optional color filter planarization layer 128 disposed between the color filter layer and the nanostructured transfer layer, wherein the nanostructured transfer layer index-matched to the color filter planarization layer. The light extraction color filter laminate 103 may further include an optional auxiliary layer 129 adjacent the high refractive index transfer layer planarization layer 126. The auxiliary layer 129 may comprise a transparent conductive oxide.

Referring to FIG. 1C, in another embodiment, the present disclosure relates to a light extraction color filter laminate 104, a support substrate 122 having a planar surface; a color filter layer 127 in contact with the planar surface of the support substrate 122; and a nanostructured transfer layer 124 having a planar surface and a nanostructured opposing surface 121. The light extraction color filter laminate 103, may further include an optional color filter planarization layer 128 disposed between the color filter layer 127 and nanostructured transfer layer 124 and in contact with the color filter layer, wherein the nanostructured transfer layer 124 is index-matched to the color filter planarization layer 128. The light extraction color filter laminate 104 may further include an optional auxiliary layer 129 disposed between the color filter planarization layer 128 and the nanostructured transfer layer 124. The auxiliary layer 129 may comprise a transparent conductive oxide.

Substrates and Supports

The substrate 122 and the support 110 can be any suitable film, including, for example, thermally stable flexible films that can provide mechanical support for the other layers. Generally, glass films are preferred, however, due to their superior thermal stability and barrier properties, compared to polymeric films. In some cases, however, polymeric films can be used.

Nanostructured Template Layer

The nanostructured template layer 124 is the layer that imparts the structure to the pOCL or any other nanostructured transfer layer (not shown, described elsewhere) that is coated onto the nanostructured template layer 124. It is made up of template materials. The nanostructured template layer 124 can be formed through embossing, replication processes, extrusion, casting, or surface structuring, for example. It is to be understood that the nanostructured template layer 124 can generally be a template layer that can have a structured surface that may include nanostructures, microstructures, or hierarchical structures, although generally nanostructures are described herein. Nanostructures comprise features having at least one dimension (e.g., height, width, or length) less than or equal to one micron. Microstructures comprise features having at least one dimension (e.g., height, width, or length) less than or equal to one millimeter. Hierarchical structures are combinations of nanostructures and microstructures. In some embodiments, the template layer can be compatible with patterning, actinic patterning, embossing, extruding, and coextruding.

Typically, the template layer includes a photocurable material that can have a low viscosity during the replication process and then can be quickly cured to form a permanent crosslinked polymeric network "locking in" the replicated nanostructures, microstructures or hierarchical structures. Any photocurable resins known to those of ordinary skill in the art of photopolymerization can be used for the template layer. The resin used for the template layer must be capable, when crosslinked, of releasing from the transfer layer during the use of the disclosed structured tapes, or should be compatible with application of a release layer (see below) and the process for applying the release layer. Additionally, the resins used for the template layer preferably are compatible with the application of an adhesion promotion layer, as described elsewhere.

Polymers that can be used as the template layer also include the following: styrene acrylonitrile copolymers; styrene(meth)acrylate copolymers; polymethylmethacrylate; polycarbonate; styrene maleic anhydride copolymers; nucleated semi-crystalline polyesters; copolymers of polyethylenenaphthalate; polyimides; polyimide copolymers; polyetherimide; polystyrenes; syndiodactic polystyrene; polyphenylene oxides; cyclic olefin polymers; and copolymers of acrylonitrile, butadiene, and styrene. One preferable polymer is the Lustran SAN Sparkle material available from Ineos ABS (USA) Corporation. Polymers for radiation cured template layers include cross linked acrylates such as multifunctional acrylates or epoxies and acrylated urethanes blended with mono- and multifunctional monomers.

Patterned structured template layers can be formed by depositing a layer of a radiation curable composition onto one surface of a radiation transmissive support to provide a layer having an exposed surface, contacting a master with a preformed surface bearing a pattern capable of imparting a three-dimensional microstructure of precisely shaped and located interactive functional discontinuities including distal surface portions and adjacent depressed surface portions into the exposed surface of the layer of radiation curable composition on said support under sufficient contact pressure to impart said pattern into said layer, exposing said curable composition to a sufficient level of radiation through the carrier to cure said composition while the layer of radiation curable composition is in contact with the patterned surface of the master. This cast and cure process can be done in a continuous manner using a roll of support, depositing a layer of curable material onto the support, laminating the curable material against a master and curing the curable material using actinic radiation. The resulting roll of support with a patterned, structured template disposed thereon can then be rolled up. This method is disclosed, for example, in U.S. Pat. No. 6,858,253 (Williams et al.).

For extrusion or embossed template layers, the materials making up the template layer can be selected depending on the particular topography of the top structured surface that is to be imparted. In general, the materials are selected such that the structure is fully replicated before the materials solidify. This will depend in part on the temperature at which the material is held during the extrusion process and the temperature of the tool used to impart the top structured surface, as well as on the speed at which extrusion is being carried out. Typically, the extrudable polymer used in the top layer has a $T_g$ of less than about 140° C., or a $T_g$ of from about 85° C. to about 120° C., in order to be amenable to extrusion replication and embossing under most operating conditions. In some embodiments, the support film and the template layer can be coextruded at the same time. This embodiment requires at least two layers of coextrusion—a top layer with one polymer and a bottom layer with another polymer. If the top layer comprises a first extrudable polymer, then the first extrudable polymer can have a $T_g$ of less than about 140° C. or a $T_g$ of from about 85° C. to about 120° C. If the top layer comprises a second extrudable polymer, then the second extrudable polymer, which can function as the support layer, has a $T_g$ of less than about 140° C. or a $T_g$ of from about 85° C. to about 120° C. Other properties such as molecular weight and melt viscosity should also be considered and will depend upon the particular polymer or polymers used. The materials used in the template layer should also be selected so that they provide good adhesion to the support so that delamination of the two layers is minimized during the lifetime of the optical article.

The extruded or coextruded template layer can be cast onto a master roll that can impart patterned structure to the template layer. This can be done batch-wise or in a continuous roll-to-roll process. Additionally, a nanostructured transfer layer can be extruded onto the extruded or coextruded template layer. In some embodiments, all three layers—support, template, and nanostructured transfer layers can be coextruded at once.

Useful polymers that may be used as the template layer polymer include one or more polymers selected from the group consisting of styrene acrylonitrile copolymers; styrene (meth)acrylate copolymers; polymethylmethacrylate; styrene maleic anhydride copolymers; nucleated semi-crystalline polyesters; copolymers of polyethylenenaphthalate; polyimides; polyimide copolymers; polyetherimide; polystyrenes; syndiodactic polystyrene; polyphenylene oxides; and copolymers of acrylonitrile, butadiene, and styrene.

Particularly useful polymers that may be used as the first extrudable polymer include styrene acrylonitrile copolymers known as TYRIL copolymers available from Dow Chemical; examples include TYRIL 880 and 125. Other particularly useful polymers that may be used as the template polymer include styrene maleic anhydride copolymer DYLARK 332 and styrene acrylate copolymer NAS 30, both from Nova Chemical. Also useful are polyethylene terephthalate blended with nucleating agents such as magnesium silicate, sodium acetate, or methylenebis(2,4-di-t-butylphenol) acid sodium phosphate.

Exemplary polymers useful as the top skin layer include CoPENs (copolymers of polyethylenenaphthalate), CoPVN (copolymers of polyvinylnaphthalene) and polyimides including polyetherimide. Suitable resin compositions include transparent materials that are dimensionally stable, durable, weatherable, and readily formable into the desired configuration. Examples of suitable materials include acrylics, which have an index of refraction of about 1.5, such as PLEXIGLAS brand resin manufactured by Rohm and Haas Company; polycarbonates, which have an index of refraction of about 1.59; reactive materials such as thermoset acrylates and epoxy acrylates; polyethylene based ionomers, such as those marketed under the brand name of SURLYN by E. I. Dupont de Nemours and Co., Inc.; (poly)ethylene-co-acrylic acid; polyesters; polyurethanes; and cellulose acetate butyrates. The template layer may be prepared by casting directly onto a support film, such as disclosed in U.S. Pat. No. 5,691,846 (Benson). Polymers for radiation cured structures include cross linked acrylates such as multifunctional acrylates or epoxies and acrylated urethanes blended with mono- and multifunctional monomers.

Adhesion Promoting Layer Materials

An adhesion promoting layer can be implemented with any material enhancing adhesion of the light extraction color filter laminate to the receptor substrate without substantially adversely affecting the performance of the light extraction color filter laminate. The exemplary materials for the transfer layer and OCL layers can also be used for the adhesion promoting layer, which preferably has a high index of refraction. Useful adhesion promoting materials useful in the disclosed articles and methods include photoresists (positive and negative), self-assembled monolayers, adhesives, silane coupling agents, and macromolecules. In some embodiments, silsesquioxanes can function as adhesion promoting layers. For example, polyvinyl silsesquioxane polymers can be used as an adhesion promoting layer. Other exemplary materials may include benzocyclobutanes, polyimides, polyamides, silicones, polysiloxanes, silicone hybrid polymers, (meth)acrylates, and other silanes or macromolecules functionalized with a wide variety of reactive groups such as epoxide, episulfide, vinyl, hydroxyl, allyloxy, (meth)acrylate, isocyanate, cyanoester, acetoxy, (meth)acrylamide, thiol, silanol, carboxylic acid, amino, vinyl ether, phenolic, aldehyde, alkyl halide, cinnamate, azide, aziridine, alkene, carbamates, imide, amide, alkyne, and any derivatives or combinations of these groups.

Release Liners

The transfer layer, OCL layer, pOCL layer, or other transferable layer, can, optionally, be covered with a temporary release liner. The release liner can protect the patterned structured layer during handling and can be easily removed, when desired, for transfer of the structured layer or part of the structured layer to a receptor substrate. Exemplary liners useful for the disclosed patterned structured tape are disclosed in Pat. Appl. Publ. No. WO 2012/082536 (Baran et al.).

The liner may be flexible or rigid. Preferably, it is flexible. A suitable liner (preferably, a flexible liner) is typically at least 0.5 mil thick, and typically no more than 20 mils thick. The liner may be a backing with a release coating disposed on its first surface. Optionally, a release coating can be disposed on its second surface. If this backing is used in a transfer article that is in the form of a roll, the second release coating has a lower release value than the first release coating. Suitable materials that can function as a rigid liner include metals, metal alloys, metal-matrix composites, metalized plastics, inorganic glasses and vitrified organic resins, formed ceramics, and polymer matrix reinforced composites.

Exemplary liner materials include paper and polymeric materials. For example, flexible backings include densified Kraft paper (such as those commercially available from Loparex North America, Willowbrook, Ill.), poly-coated paper such as polyethylene coated Kraft paper, and polymeric film. Suitable polymeric films include polyester, polycarbonate, polypropylene, polyethylene, cellulose, polyamide, polyimide, polysilicone, polytetrafluoroethylene, polyethylenephthalate, polyvinylchloride, polycarbonate, or combinations thereof. Nonwoven or woven liners may also be useful. Embodiments with a nonwoven or woven liner could incorporate a release coating. CLEARSIL T50 Release liner; silicone coated 2 mil polyester film liner, available from Solutia/CP Films, Martinsville, Va., and LOPAREX 5100 Release Liner, fluorosilicone-coated 2 mil polyester film liner available from Loparex, Hammond, Wis., are examples of useful release liners.

The release coating of the liner may be a fluorine-containing material, a silicon-containing material, a fluoropolymer, a silicone polymer, or a poly(meth)acrylate ester derived from a monomer comprising an alkyl (meth)acrylate having an alkyl group with 12 to 30 carbon atoms. In one embodiment, the alkyl group can be branched. Illustrative examples of useful fluoropolymers and silicone polymers can be found in U.S. Pat. No. 4,472,480 (Olson), U.S. Pat. Nos. 4,567,073 and 4,614,667 (both Larson et al.). Illustrative examples of a useful poly(meth)acrylate ester can be found in U. S. Pat. Appl. Publ. No. 2005/118352 (Suwa). The removal of the liner shouldn't negatively alter the surface topology of the transfer layer.

Other Additives

Other suitable additives to include in the transfer, OCL, pOCL, and adhesion promotion layer are antioxidants, stabilizers, antiozonants and/or inhibitors to prevent premature curing during the process of storage, shipping and handling of the film. Preventing premature curing can maintain the tack required for lamination transfer in all previously mentioned embodiments. Antioxidants can prevent the formation of free radical species, which may lead to electron transfers and chain reactions such as polymerization. Antioxidants can be used to decompose such radicals. Suitable antioxidants may include, for example, antioxidants under the IRGANOX tradename. The molecular structures for antioxidants are typically hindered phenolic structures, such as 2,6-di-tert-butylphenol, 2,6-di-tert-butyl-4-methylphenol, or structures based on aromatic amines. Secondary antioxidants are also used to decompose hydroperoxide radicals, such as phosphites or phosphonites, organic sulphur containing compounds and dithiophosphonates. Typical polymerization inhibitors include quinone structures such hydroquinone, 2,5 di-tert-butyl-hydroquinone, monomethyl ether hydroquinone or catechol derivatives such as 4-tert butyl catechol. Any antioxidants, stabilizers, antiozonants and inhibitors used must be soluble in the transfer, OCL, and adhesion promotion layer.

Unless otherwise indicated, all numbers expressing feature sizes, amounts, and physical properties used in the specification and claims are to be understood as being modified by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

All references and publications cited herein are expressly incorporated herein by reference in their entirety into this disclosure, except to the extent they may directly contradict this disclosure. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A color filter laminate, comprising:
    a support substrate having a planar surface;
    a color filter layer in contact with the planar surface of the support substrate;
    a structured optical film having a planar surface in contact with the color filter layer and a microstructured opposing surface; and
    an auxiliary layer comprising a transparent conductive oxide disposed between the color filter layer and the structured optical film.

2. The color filter laminate of claim 1, wherein the microstructured opposing surface comprises one of a microlens array, a Fresnel array, or a refractive, diffractive, or hybrid optical element.

* * * * *